(12) United States Patent
Nishiyama et al.

(10) Patent No.: US 8,796,701 B2
(45) Date of Patent: Aug. 5, 2014

(54) DISPLAY PANEL APPARATUS AND METHOD OF FABRICATING DISPLAY PANEL APPARATUS

(75) Inventors: Seiji Nishiyama, Osaka (JP); Takashi Osako, Kyoto (JP); Shinya Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 319 days.

(21) Appl. No.: 13/356,666

(22) Filed: Jan. 24, 2012

(65) Prior Publication Data

US 2012/0119235 A1 May 17, 2012

Related U.S. Application Data

(63) Continuation of application No. PCT/JP2010/006175, filed on Oct. 19, 2010.

(30) Foreign Application Priority Data

Nov. 4, 2009 (JP) ................................ 2009-253537

(51) Int. Cl.
*H01L 29/18* (2006.01)
(52) U.S. Cl.
USPC .. 257/88; 257/40; 257/E51.019; 257/E31.095
(58) Field of Classification Search
USPC ........................ 257/88, 40, E51.019, E31.095
See application file for complete search history.

(56) References Cited

U.S. PATENT DOCUMENTS

| 7,683,537 B2 | 3/2010 | Yoshida et al. |
| 7,764,014 B2 | 7/2010 | Yoshida et al. |
| 7,812,345 B2 | 10/2010 | Yoshida et al. |
| 7,842,947 B2 | 11/2010 | Yoshida et al. |
| 7,888,867 B2 | 2/2011 | Yoshida et al. |
| 7,932,109 B2 | 4/2011 | Hayata et al. |
| 7,964,416 B2 | 6/2011 | Miyazawa |
| 8,017,940 B2 | 9/2011 | Hotta et al. |
| 8,080,935 B2 | 12/2011 | Yoshida et al. |
| 8,094,096 B2 | 1/2012 | Okumoto |

(Continued)

FOREIGN PATENT DOCUMENTS

| CN | 101005117 | 7/2007 |
| CN | 101409304 | 4/2009 |

(Continued)

OTHER PUBLICATIONS

U.S. Appl. No. 13/292,595 to Yosuke Izawa, filed Nov. 9, 2011.

(Continued)

*Primary Examiner* — Timor Karimy
(74) *Attorney, Agent, or Firm* — Greenblum & Bernstein, P.L.C.

(57) ABSTRACT

A display panel apparatus includes a planarizing film formed on a substrate, at least one pixel including a lower electrode; an organic EL layer; and an upper electrode which are formed above the planarizing film; an auxiliary electrode electrically connected to the upper electrode which is the opposite to the lower electrode; a display section including a plurality of the pixels; an electrode plate electrically connected to the auxiliary electrode and arranged to cover the planarizing film outside the display section, and the electrode plate has a hole exposing a part of a surface of the planarizing film. Furthermore, the display panel apparatus also includes a hole injection layer which is an inorganic material layer made of an inorganic material and covering the hole.

15 Claims, 26 Drawing Sheets

(56) References Cited

U.S. PATENT DOCUMENTS

| | | |
|---|---|---|
| 8,130,177 B2 | 3/2012 | Takagi |
| 8,247,804 B2 * | 8/2012 | Seo et al. .................. 257/40 |
| 2006/0060850 A1 | 3/2006 | Kwak et al. |
| 2006/0061268 A1 | 3/2006 | Nakanishi |
| 2006/0186825 A1 | 8/2006 | Nakanishi |
| 2006/0281208 A1 | 12/2006 | Lau et al. |
| 2007/0069212 A1 | 3/2007 | Yoshida et al. |
| 2007/0159073 A1 | 7/2007 | Tsutsui et al. |
| 2007/0164275 A1 | 7/2007 | Ishiguro |
| 2007/0241665 A1 | 10/2007 | Sakanoue et al. |
| 2008/0079361 A1 | 4/2008 | Nakanishi |
| 2009/0042329 A1 | 2/2009 | Lau et al. |
| 2009/0045724 A1 * | 2/2009 | Tagawa et al. ............... 313/504 |
| 2009/0096371 A1 | 4/2009 | Matsudate et al. |
| 2009/0206752 A1 | 8/2009 | Nakanishi |
| 2010/0084646 A1 | 4/2010 | Matsusue et al. |
| 2010/0171415 A1 | 7/2010 | Akamatsu et al. |
| 2010/0182222 A1 | 7/2010 | Ichihashi et al. |
| 2010/0219424 A1 | 9/2010 | Yoshida et al. |
| 2010/0252857 A1 | 10/2010 | Yoshida |
| 2010/0253706 A1 | 10/2010 | Shirouzu |
| 2010/0309101 A1 | 12/2010 | Kanegae et al. |
| 2010/0327297 A1 | 12/2010 | Yoshida et al. |
| 2011/0128211 A1 | 6/2011 | Ono |
| 2011/0165517 A1 | 7/2011 | Nishiyama et al. |
| 2011/0180821 A1 | 7/2011 | Matsushima |
| 2011/0186903 A1 | 8/2011 | Nakanishi |
| 2011/0198623 A1 | 8/2011 | Matsushima |
| 2011/0198624 A1 | 8/2011 | Matsushima |
| 2011/0204410 A1 | 8/2011 | Yada |
| 2011/0272677 A1 | 11/2011 | Takeuchi |
| 2011/0291087 A1 | 12/2011 | Harada et al. |
| 2011/0291128 A1 | 12/2011 | Harada et al. |
| 2011/0316414 A1 | 12/2011 | Nendai |
| 2012/0001186 A1 | 1/2012 | Kondoh et al. |
| 2012/0025224 A1 | 2/2012 | Yuasa |
| 2012/0025699 A1 | 2/2012 | Okumoto et al. |
| 2012/0032207 A1 | 2/2012 | Nishiyama et al. |
| 2012/0040478 A1 | 2/2012 | Takeuchi |
| 2012/0049175 A1 | 3/2012 | Ono et al. |
| 2012/0049211 A1 | 3/2012 | Komatsu et al. |

FOREIGN PATENT DOCUMENTS

| | | |
|---|---|---|
| EP | 2009680 | 12/2008 |
| JP | 2005-242383 | 9/2005 |
| JP | 2005-243564 | 9/2005 |
| JP | 2005-322639 | 11/2005 |
| JP | 2005-338789 | 12/2005 |
| JP | 2006-324238 | 11/2006 |
| JP | 2007-317459 | 12/2007 |
| WO | 2009/110186 | 9/2009 |

OTHER PUBLICATIONS

U.S. Appl. No. 13/403,375 to Yasuo Segawa et al., filed Feb. 23, 2012.
U.S. Appl. No. 13/403.489 to Yasuo Segawa et al., filed Feb. 23, 2012.
U.S. Appl. No. 13/281,841 to Arinobu Kanegae, filed Oct. 26, 2011.
U.S. Appl. No. 13/281,691 to Arinobu Kanegae, filed Oct. 26, 2011.
U.S. Appl. No. 13/313,452 to Kenji Okumoto, filed Dec. 7, 2011.
U.S. Appl. No. 13/357,854 to Yosuke Izawa et al., filed Jan. 25, 2012.
U.S. Appl. No. 13/370,842 to Yasuo Segawa, filed Feb. 10, 2012.
U.S. Appl. No. 13/296,725 to Seiji Nishiyama et al., filed Nov. 15, 2011.
U.S. Appl. No. 13/287,526 to Keiko Kurata et al., filed Nov. 2, 2011.
U.S. Appl. No. 13/360,984 to Satoru Ohuchi et al., filed Jan. 30, 2012.
U.S. Appl. No. 13/361,006 to Keiko Kurata et al., filed Jan. 30, 2012.
U.S. Appl. No. 13/361,280 to Takashi Isobe et al., filed Jan. 30, 2012.
U.S. Appl. No. 13/292,546 to Takayuki Takeuchi et al., filed Nov. 9, 2011.
U.S. Appl. No. 13/352,921 to Takayuki Takeuchi, filed Jan. 18, 2012.
U.S. Appl. No. 13/309,775 to Hideaki Matsushima, filed Dec. 2, 2011.
U.S. Appl. No. 13/309,768 to Hideaki Matsushima, filed Dec. 2, 2011.
U.S. Appl. No. 13/313,206 to Hideaki Matsushima, filed Dec. 7, 2011.
U.S. Appl. No. 13/313,214 to Hideaki Matsushima, filed Dec. 7, 2011.
U.S. Appl. No. 13/356,111 to Takayuki Takeuchi, filed Jan. 23, 2012.
U.S. Appl. No. 13/365,893 to Takayuki Takeuchi, filed Feb. 3, 2012.
China Office action, dated Dec. 23, 2013 along with an english translation thereof.

* cited by examiner

Aperture ratio 0%
Resistance value 1.0

Aperture ratio 10%
Resistance value 1.2

Aperture ratio 9%
Resistance value 1.9

Aperture ratio 9%
Resistance value 1.1

(Display section 52)

(Feeder 28)   Resistance component 0.20 Ω   Direction of current — 33

(Display section 52)

(Feeder 28)   Resistance component 0.37 Ω   Direction of current — 33

DISPLAY PANEL APPARATUS AND METHOD OF FABRICATING DISPLAY PANEL APPARATUS

CROSS-REFERENCE TO RELATED APPLICATIONS

This is a continuation application of PCT Patent Application No. PCT/JP2010/006175 filed on Oct. 19, 2010, designating the United States of America, which is based on and claims priority of Japanese Patent Application No. 2009-253537 filed on Nov. 4, 2009. The entire disclosures of the above-identified applications, including the specifications, drawings and claims are incorporated herein by reference in their entirety.

BACKGROUND OF THE INVENTION (1) Field of the Invention

The present invention relates to display panel apparatuses and methods of fabricating the display panel apparatuses, and particularly relates to an organic electroluminescent (EL) display panel apparatus using organic luminescent material.

(2) Description of the Related Art

The organic EL display apparatus is a light-emitting display apparatus using electroluminescence of organic compounds, and has been in practical use as a small display apparatus used for mobile phones and others.

The organic EL display apparatus is configured by organic EL devices arranged on a substrate. The organic EL devices can be individually controlled per pixel for light-emission. A typical organic EL display apparatus is manufactured by stacking a driving circuit, an anode, an organic layer, and a cathode on a substrate. The organic layer includes, in addition to an organic EL layer made of an organic compound, at least one of functional layers such as a hole transport layer and an electron transport layer. With this configuration, charge is injected to the organic EL layer from the anode or the cathode through the hole transport layer and others, and the injected charge is recombined in the organic EL layer, and the organic EL layer emits light.

It is important that the operational current sufficient for the organic EL display device in each pixel is supplied in order to obtain good display quality in the organic EL display apparatus. This is because lack of sufficient operational current supply decreases luminance, causes uneven luminance, and reduction in contrast, which are causes for degraded display quality.

Conventionally, in order to achieve good display quality, a configuration for supplying sufficient operational current to the organic EL device in each pixel of the organic EL display apparatus has been proposed (for example, see Patent Literature 1: Japanese Unexamined Patent Application Publication No. 2005-242383).

The light-emitting apparatus according to Patent Literature 1 includes a cathode-line connected to the cathode, which is provided outside of the effective region in which pixels each including a light-emitting device (referred to as display section in this Specification) is provided to surround the effective region, and the power supply line connected to the pixel electrodes is provided between the cathode-line and the effective region.

According to the light-emitting apparatus with the configuration described above, it is possible to secure sufficient contact area for the cathode-line and the cathode, while suppressing the electric resistance between them to minimum. Accordingly, it is possible to prevent the reduction in the amount of current supplied to the light-emitting device by a voltage drop due to the electric resistance.

In terms of the viewpoint for supplying the sufficient operational current to the organic EL device, larger area of the cathode-line in the light-emitting apparatus according to the conventional technology is preferable. However, providing the cathode-line in a wide area surrounding the display section raises the following problems with the conventional technology.

More specifically, in the fabrication process of the display apparatus, the lower electrode separated for each pixel is generally formed by photo etching after forming the planarizing film is formed, and the organic layer is subsequently stacked. When forming the planarizing film and the lower electrode, due to cleaning water and chemical solutions such as develop solution and acid, moisture, acid, and other components are absorbed by the planarizing film. Accordingly, if the planarizing film with the moisture and acid absorbed is covered by an electrode plate used for the cathode-line, for example, the planarizing film is sealed with the moisture and acid absorbed inside.

If the organic layer is stacked above the planarizing film in this state, the components such as moisture and acid included in the planarizing film may leak to the organic layer. As a result, the quality of the organic layer is degraded due to the reaction of the organic layer with the components such as moisture, acid, and others, causing a problem of shrinking pixels. In particular, when Balium (hereafter referred to as Ba) is included in the organic layer, Ba reacts to the moisture, shrinking the pixels.

Furthermore, due to gas components such as moisture and acid sealed in the planarizing film, the electrode plate is peeled off by the pressure of the gas component, leaking components such as moisture and acid to the organic layer at the peripheral portion of the display section. As a result, there is a problem that the organic layer at the peripheral portion of the display section reacts with the components such as moisture and acid, changing the injection property of the organic layer. As a result, this causes a problem of uneven display at the peripheral portion. In particular, when Ba is included in the organic layer, Ba in the organic layer reacts with moisture, turning the peripheral portion white.

Patent Literature 1 fails to suggest an effective solution for overcoming these problems concerned in a case where the electrode plate used as the cathode-line is provided, and the planarizing film covers a wide region surrounding the display section.

SUMMARY OF THE INVENTION

The present invention has been conceived in view of the problems, and it is an object of the present invention to provide a display panel apparatus including an electrode plate for supplying the operational current for the organic EL device, and with a configuration which is less likely to seal the planarizing film even when the electrode plate is provided in a wide region above the planarizing film, and to provide the method of fabricating the display panel apparatus.

In order to solve the problems described above, an aspect of the display panel apparatus according to the present invention includes: at least one pixel including: a lower electrode; an upper electrode provided opposite to the lower electrode; and an organic layer having organic material and provided between the lower electrode and the upper electrode; a TFT layer formed below the pixel and including a driving device for driving the pixel; a planarizing film for planarizing an upper surface of the TFT layer; an auxiliary electrode formed separately from the lower electrode and electrically connected to the upper electrode; a display section including a plurality of the pixels; an electrode plate electrically connected to the auxiliary electrode and arranged to cover the planarizing film outside the display section, the electrode plate having a hole exposing a part of a surface of the planarizing film; and an inorganic material layer made of an inorganic material, in contact with an upper surface of the electrode plate, located below the upper electrode, and covering the hole, the inorganic material layer being formed after the electrode plate is formed and before the organic layer is formed.

The display panel apparatus according to the present invention includes holes for exposing a part of the surface of the planarizing film covering the electrode plate. Thus, the components such as moisture and acid which affect the organic material in the planarizing film arranged under the electrode plate can be outgassed through the holes of the electrode plate.

As a result, the defect caused by sealing the components such as moisture and acid in the planarizing film can be reduced compared to the case in which no hole is provided in the electrode plate.

Furthermore, in the display panel apparatus according to the present invention, the holes in the electrode plate are covered by the inorganic material layer made of inorganic material, and thus in the fabrication process after the electrode plate is formed, it is possible to prevent the foreign material such as moisture and acid from entering the planarizing film again through the holes.

Therefore, it is possible to further reduce the defects caused by the components such as moisture and acid sealed in the planarizing film by the electrode plate.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
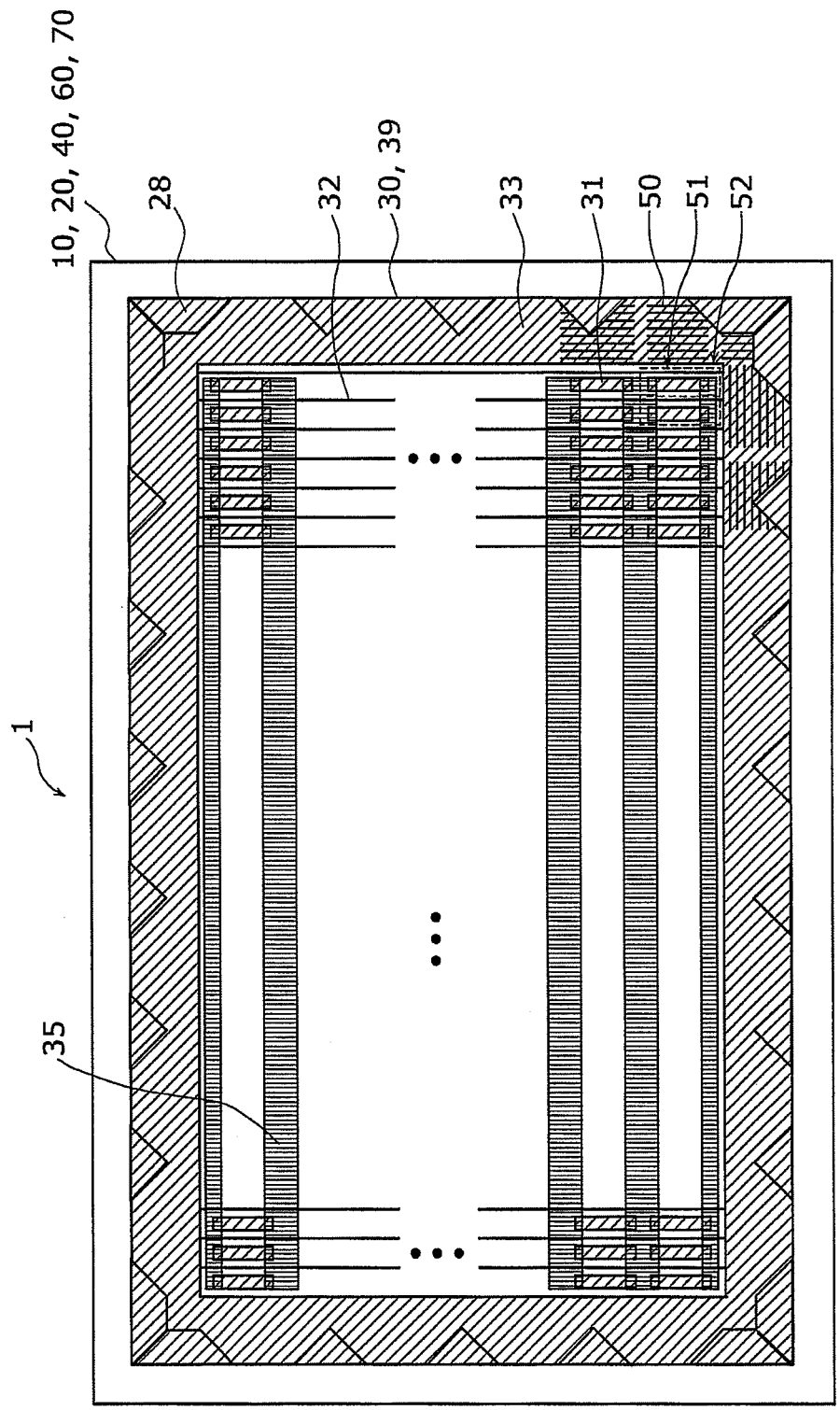
FIG. 1 is a planar view illustrating an example of the configuration of the display panel apparatus according to Embodiment 1 of the present invention.

The display panel apparatus according to an aspect of the present invention includes: at least one pixel including: a lower electrode; an upper electrode provided opposite to the lower electrode; and an organic layer having organic material and provided between the lower electrode and the upper electrode; a TFT layer formed below the pixel and including a driving device for driving the pixel; a planarizing film for planarizing an upper surface of the TFT layer; an auxiliary electrode formed separately from the lower electrode and electrically connected to the upper electrode; a display section including a plurality of the pixels; an electrode plate electrically connected to the auxiliary electrode and arranged to cover the planarizing film outside the display section, the electrode plate having a hole exposing a part of a surface of the planarizing film; and an inorganic material layer made of an inorganic material, in contact with an upper surface of the electrode plate, located below the upper electrode, and covering the hole, the inorganic material layer being formed after the electrode plate is formed and before the organic layer is formed.

The display panel apparatus according to another aspect of the present invention includes: at least one pixel including: a lower electrode; an upper electrode provided opposite to the lower electrode; and an organic layer having organic material and provided between the lower electrode and the upper electrode; a TFT layer formed below the pixel and including a driving device for driving the pixel; a planarizing film for planarizing an upper surface of the TFT layer; an auxiliary electrode formed separately from the lower electrode and electrically connected to the upper electrode; a display section including a plurality of the pixels; an electrode plate formed in a same layer as the lower electrode, electrically connected to the auxiliary electrode, and arranged to cover the planarizing film outside the display section, the electrode plate having a hole exposing a part of a surface of the planarizing film; and an inorganic material layer made of an inorganic material located above the electrode plate, and covering the hole, the inorganic material layer being a part of a layer formed between the lower electrode and the organic layer in the pixel.

The display panel apparatus according to an aspect of the present invention has holes in the electrode plate covering the planarizing film, which exposes a part of the surface of the planarizing film. With this, even if the planarizing film with the components such as moisture and acid are absorbed within is covered by the electrode plate, the components such as moisture and acid in the planarizing film are outgassed through the holes.

In addition, in any display panel apparatus according to an aspect, the holes in the electrode plate are covered by the inorganic material layer made of inorganic material. With this, in the fabrication process after the electrode plate is formed, it is possible to prevent the foreign material such as moisture and acid from entering the planarizing film again through the holes. In particular, any of the display panel apparatuses has a technical feature that the inorganic material layer is formed after the electrode plate is formed and before the organic layer is formed. Accordingly, it is possible to prevent foreign materials such as moisture and acid in the organic EL layer forming process from entering the inside of the planarizing film through the holes in the electrode plate.

Accordingly, it is possible to prevent the unevenness in display at the peripheral portion or the pixels from shrinking due to the leak of the components such as moisture and acid affecting the organic material to the organic layer at the peripheral portion in the display section, and the reaction of the organic layer with the components such as moisture and acid. In particular, when the organic layer includes Ba, the moisture reacts with the Ba, and Ba oxidized by moisture shrinks the pixels and turns the peripheral portion into white. These problems can also be prevented.

Furthermore, in addition to outgassing the components such as moisture and acid by the holes and covering the holes with the inorganic material layer prevents the foreign material such as moisture and acid which are causes of the outgas from entering the planarizing film again. Thus, it is possible to prevent the electrode plate from peeling by the gas pressure due to the gas components such as moisture and acid remaining in the planarizing film. Furthermore, it is possible to prevent the planarizing film from being eroded by moisture and acid remaining in the planarizing film.

In an aspect of the display panel apparatus, it is preferable that the inorganic material layer includes: a first portion located in the pixel, which serves as a functional layer provided between the lower electrode and the organic layer; and a second portion extending from the first portion and arranged outside the pixel such that at least a part of the second portion covers the hole.

In this aspect, the organic layer is formed with the holes in the electrode plate covered with the inorganic layer. Accordingly, it is possible to prevent the foreign material such as processing solutions including water and acid from entering the planarizing film again through the holes during the fabrication process after the organic layer is formed.

In addition, since the inorganic material layer is made of the first portion as the functional layer formed in the pixel and the second portion covering the holes formed outside of the pixel, it is possible to form the inorganic layer using the functional layer in the pixel. With this, it is possible to simplify the fabrication process, and reduce the fabrication cost.

In another aspect of the display panel apparatus, it is preferable that the inorganic material layer includes at least one of a hole injection layer for injecting holes from the lower electrode into the organic layer and a pixel regulating layer for regulating the pixel.

According to this aspect, the inorganic material layer can be formed using the hole injection layer or the pixel regulating layer which are layers made of inorganic material present in the display section. Therefore, it is possible to form these layers and the inorganic material layer at the same time. With this, it is possible to simplify the fabrication process, and reduce the fabrication cost.

In another aspect of the display panel apparatus, it is preferable that the inorganic material has an insulation property.

In another aspect of the display panel apparatus, it is preferable that the inorganic material is one of metal oxide, metal nitride, or metal oxynitride.

In another aspect of the display panel apparatus, it is preferable that the inorganic material is at least one of Si, W, Cr, Ti, Mo, V, and Ga.

In another aspect of the display panel apparatus, it is preferable that the inorganic material layer includes two or more layers.

According to this aspect, the inorganic material layer can be formed with multiple layers. Thus, in the process after forming the inorganic material layer, it is possible to reliably prevent the foreign material such as moisture and acid from entering the planarizing film again through the holes.

In another aspect of the display panel apparatus, it is preferable that the hole is for discharging a gas generated inside the planarizing film to outside the planarizing film.

The display panel apparatus according to an aspect of the present invention include an aspect of the display panel apparatus, in which the pixels in the display panel apparatus are arranged in a matrix.

The method of fabricating the display panel apparatus according to an aspect of the present invention includes: forming a TFT layer including a driving device for driving an organic EL layer to emit light; forming a planarizing film for planarizing an upper surface of the TFT layer; forming a lower electrode above the planarizing film in a display section of a display panel, forming an electrode plate having a hole above the planarizing film outside the display section of the display panel, and forming an auxiliary electrode separately from the lower electrode and electrically connected to the electrode plate, the auxiliary electrode being formed in the display section of the display panel above the planarizing film and outside an area in which the lower electrode is formed; forming an inorganic material layer made of an inorganic material above the electrode plate; forming a partition for partitioning pixels above the lower electrode; forming the organic EL layer in a region partitioned by the partition; and forming, above the organic EL layer, an upper electrode for causing the organic EL layer to emit light through a current supply with the lower electrode, the upper electrode being electrically connected to the auxiliary electrode, in which the electrode plate is formed to expose a part of a surface of the planarizing film in the forming, and the inorganic material layer is formed to cover the hole in the electrode plate in the forming.

According to this aspect, in the forming of a lower electrode, an electrode plate, and an auxiliary electrode, the electrode plate including holes exposing a part of the surface of the planarizing film on the planarizing film outside of the display section, and in the inorganic layer forming, the holes are covered by the inorganic material layer made of inorganic material.

With this, even if the planarizing film with the components such as moisture and acid absorbed is covered by the electrode plate, the components such as moisture and acid can be outgassed through the holes before the inorganic layer forming.

Subsequently, the holes are covered by the inorganic material layer in the inorganic layer forming. Thus, in the fabrication process after the inorganic layer forming, it is possible to prevent the foreign material such as moisture and acid from entering the planarizing film again through the holes.

Accordingly, it is possible to prevent the uneven display and shrunken pixels at the peripheral portion due to the leak of the components such as moisture and acid which could affect the organic material and the reaction of the organic layer with the components such as moisture and acid. In particular, when the organic layer includes Ba, the moisture reacts with the Ba, and Ba oxidized by moisture shrinks the pixels and turns the peripheral portion white. This can also be prevented.

In addition, by outgassing the components such as moisture and acid by the holes and covering the holes with the inorganic layer prevents the components such as moisture and acid which would cause the outgassing from entering the planarizing film again, and the peeling of the electrode plate from peeling by the gas pressure of the gas components such as moisture and acid remaining in the planarizing film. Furthermore, it is possible to prevent the planarizing film from being eroded by moisture and acid remaining in the planarizing film.

In another aspect of the method of fabricating the display panel apparatus, it is preferable that, in the forming, the inorganic material layer is formed above the lower electrode and in a display section in the display panel, and a part of the inorganic material layer is formed to extend to outside the display section in the display panel and to cover the hole in the electrode plate.

According to this aspect, in the inorganic layer forming, the inorganic material layer made of inorganic material is formed above the lower electrode in the display section in the display panel, and covering the holes outside of the display section in the display panel. With this, it is possible to form the functional layer in the display section and the inorganic material layer covering the holes at the same time. Thus, it is possible to simplify the fabrication process and reduce the fabrication cost.

In another aspect of the method of fabricating display panel apparatus, it is preferable that the inorganic material layer is at least one of a hole injection layer for injecting holes from the lower electrode into the organic layer and a pixel regulating layer for regulating the pixel.

According to this aspect, the inorganic material layer may be formed using the fabrication process for fabricating the hole injection layer or the pixel regulating layer present in the display section. With this, it is possible to form an inorganic material layer covering the holes without increasing the number of processes.

In another aspect of the method of fabricating display panel apparatus, it is preferable that, in the forming of a lower electrode, an electrode plate, and an auxiliary electrode, a gas generated inside the planarizing film is discharged through the hole in the electrode plate, and in the forming of an inorganic material layer, the hole is covered so as to prevent a foreign material from entering the planarizing film from outside through the holes.

In another aspect of the method of fabricating display panel apparatus, it is preferable that the forming of a lower electrode, an electrode plate, and an auxiliary electrode is a process including a thermal treatment.

According to this aspect, it is possible to aggressively discharge the components such as moisture and acid present in the planarizing film through the holes in the electrode plate by the thermal treatment in the forming of a lower electrode, an electrode plate, and an auxiliary electrode. Subsequently, in the inorganic layer forming, the holes are covered by the inorganic material layer. Thus, in the fabrication process after the inorganic layer forming, it is possible to prevent the foreign material such as moisture and acid from entering the planarizing film again through the holes in the fabrication process after the fourth process. Accordingly, it is possible to fabricate the display panel apparatus having a planarizing film without the components such as moisture or acid.

The following shall describe the display panel apparatus according to Embodiments of the present invention in detail with reference to the drawings.

Note that, in the description of the Embodiments, an example in which an active-matrix organic EL display panel apparatus is used is described as a typical example. However, the display panel apparatus according to the present invention is not limited to the organic EL display panel apparatus, but is widely applicable to a display panel apparatus having a display section which includes arranged pixels which can be individually controlled for light-emission, and an electrode plate as a line for supplying operational current of the pixels arranged in the display section.

The drawings are schematic diagrams for description, and thickness, ratio of the size of components, and the number of the components which are repeatedly arranged are not always exactly precise.

Embodiment 1

The following shall describe the display panel apparatus according to Embodiment 1 of the present invention with reference to the drawings.

(Overview of the Display Panel Apparatus)

FIG. 1 is a planar view illustrating an example of the configuration of the display panel apparatus according to Embodiment 1 of the present invention.

As illustrated in FIG. 1, the display panel apparatus 1 is configured with a stacked structure including a TFT layer 20 and a planarizing film 30 stacked on a substrate 10 in this order, a display section 52 provided with the arranged pixels 51 which can be individually controlled for light emission, and a sealing film 40, a resin layer 60, and a glass substrate 70 sealing the entire surface.

The display section 52 includes pixels 51 arranged in a matrix. The pixels 51 include the organic EL device having lower electrodes 31 separated for each pixel 51, an upper electrode 39 provided on the entire surface and shared by all of the pixels 51, an organic layer which has electroluminescent property and is interposed between the lower electrode 31 and the upper electrode 39, and a hole injection layer 34 which shall be described later. The organic layer of the organic EL device is a stacked structure of the hole transport layer, the organic EL layer, and an electron transport layer that are made of organic material.

Furthermore, as illustrated in FIG. 1, the electrode plate 33 is formed in a shape of frame surrounding the pixels 51 in the matrix. In the display section 52, auxiliary electrodes 32 are formed in the belt-shape for each pixels 51 in the column direction of the pixels 51 (vertical direction of the drawing). The auxiliary electrode 32 and the electrode plate 33 are electrically connected to the upper electrode 39, and are lines the current flow in the organic EL device in the pixel 51 together with the upper electrode 39. In this Embodiment, the auxiliary electrode 32 is electrically connected to the upper electrode 39 in the organic EL device through the electron transport layer. The auxiliary electrode 32 prevents the voltage drop caused by the upper electrode 39 common to all of the pixels 51, particularly a voltage drop at the central region of the display screen.

The upper electrode 39 is connected to the auxiliary electrode 32 through the electron transport layer in the display section 52, and is connected to the electrode plate 33 outside of the display section 52. The auxiliary electrode 32 is connected to the electrode plate 33, and the electrode plate 33 is connected to a feeder 28. The lower electrode 31 is connected to the driving device provided in the TFT layer 20. In order to facilitate the understanding, the area in which the lower electrode 31 and the electrode plate 33 are formed is indicated by left-upward hatching.

In the row direction of the pixels 51 (horizontal direction of the drawing), the pixel regulating layer 35 is formed in a belt-shape. The pixel regulating layer 35 is formed to cover the peripheral portion of the adjacent pixels 51 in the vertical direction. For example, the pixel regulating layer 35 covers inside of the contact hole and the lower electrode 31 nearby. With this, the pixel regulating layer 35 prevents the light emission at the contact hole in which the thickness of the organic EL layer 37 is difficult to control and the light-emission tends to be unstable. In order to facilitate the understanding, the range in which the pixel regulating layer 35 is formed is indicated by the vertical hatching. Note that, in Embodiment 1, it is not necessary to provide the pixel regulating layer 35.

In each pixel 51, the organic layer emits light by the operational current supplied from the driving device through the lower electrode 31, and flowing to the feeder 28 through the upper electrode 39.

In Embodiment 1, the electrode plate 33 is formed to cover the planarizing film 30 outside of the display section 52, and has holes 50 exposing part of the surface of the planarizing film 30. Note that, in FIG. 1, although the holes 50 are only illustrated at the lower right corner of the display panel apparatus 1, the holes 50 are actually formed in the entire region of the electrode plate 33 outside of the display section 52.

In the display panel apparatus 1 with the configuration described above, by providing the electrode plate 33 connected to the upper electrode 39 in a wide region outside of the display section 52, it is possible to suppress the electric resistance from the pixels 51 to the feeder 28 at a low value. In addition, since the holes 50 are provided in the electrode plate 33, and thus the holes 50 can outgas components inside the planarizing film 30.

As a result, the reduction in luminance, uneven luminance, and reduction in contrast all caused by the insufficient supply of the operational current are eased, increasing the display quality, and the defect caused by the sealed components such as moisture and acid in the planarizing film 30 is reduced as well.

Furthermore, in Embodiment 1, the holes 50 in the electrode plate 33 are covered with the inorganic material layer made of inorganic material. Note that, in Embodiment 1, the inorganic material layer is formed using the hole injection layer 34 made of inorganic material formed in the pixels 51.

With this, after outgassing the components such as moisture and acid in the planarizing film 30 through the holes 50, the holes 50 can be closed by the hole injection layer 34. Accordingly, in the fabrication process after the holes 50 are closed, it is possible to prevent the foreign material such as moisture and acid from entering the planarizing film again through the holes 50. Accordingly, it is possible to prevent the uneven display at the peripheral portion or the peripheral portion from turning white due to the leaked components such as moisture and acid to the organic layer at the peripheral portion of the display section 52. Furthermore, it is also possible to prevent the electrode plate 33 from being peeled off by a gas pressure of the gas components such as the moisture and acid remaining in the planarizing film 30. It is also possible to prevent the planarizing film from being eroded by the moisture and acid remaining in the planarizing film.

Figure 2:
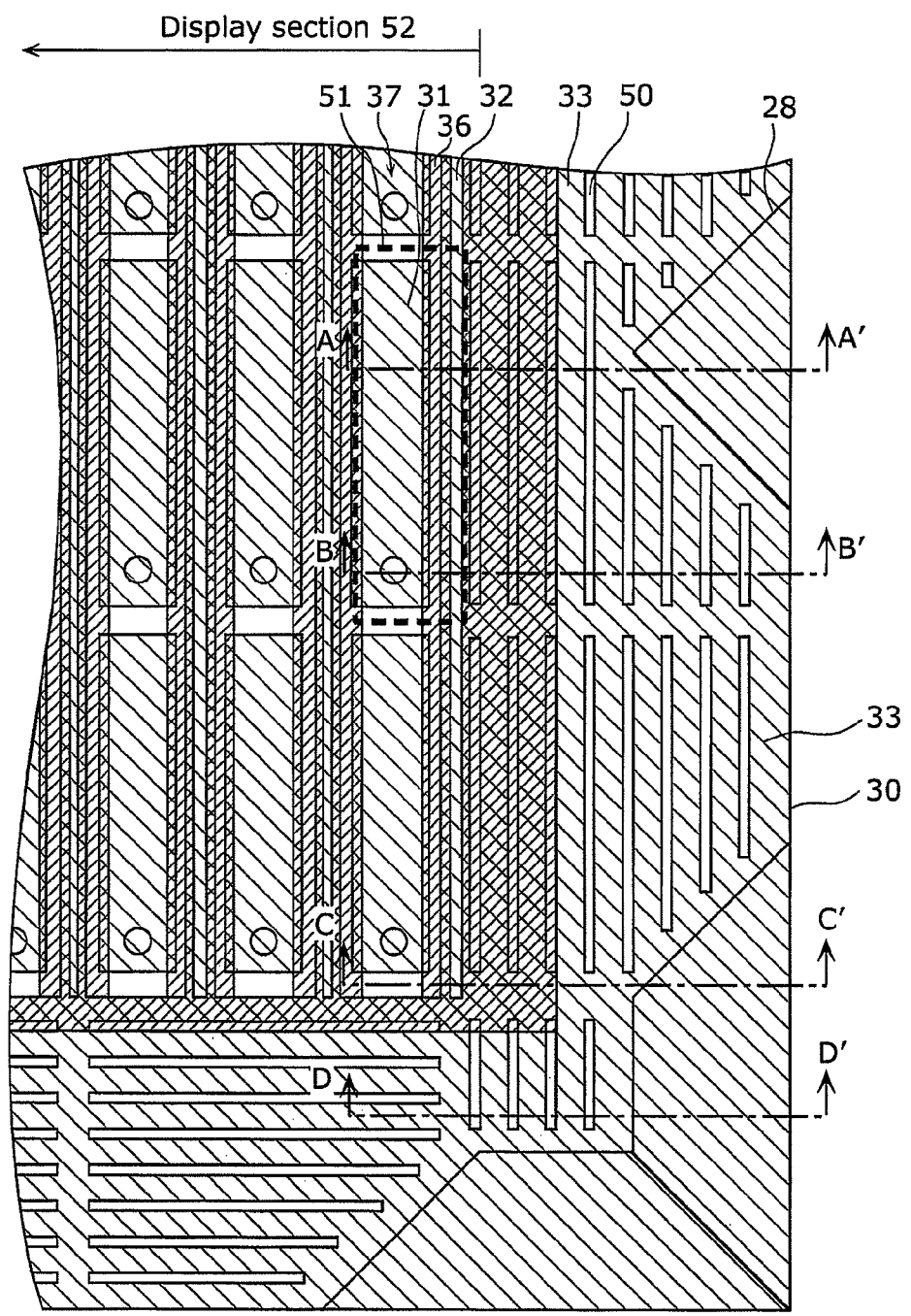
FIG. 2 is an enlarged planar view illustrating an example of the configuration of the display panel apparatus according to Embodiment 1 of the present invention.

FIG. 2 is an enlarged planar view illustrating details of the lower right corner of the display panel apparatus 1. Note that, the illustration of the pixel regulating layer 35 illustrated in FIG. 1 is omitted.

As illustrated in FIG. 2, the feeder 28 is a triangle with a vertex pointed to the display section 52. A bank 36 is provided, for example, along the column direction of the pixels 51 (vertical direction of the drawing). The auxiliary electrode 32 is provided in a region in which the lower electrode 31 is not formed, in a direction in parallel with the bank 36. The organic EL layer 37 is arranged in a belt-shaped region partitioned by the adjacent banks 36.

In the configuration illustrated in FIG. 2, for each belt-shaped region partitioned by the banks 36, the organic EL layer 37 which emits light in red, blue, or green is provided so as to configure a color display panel apparatus. In this case, each pixel 51 corresponds to a sub pixel, and composes one pixel by three adjacent pixels 51 each of which emits light in red, blue, or green.

In the electrode plate 33, long rectangle holes 50 are provided along the direction of the operational current flowing for each pixel 51 in the electrode plate 33. Each of the holes 50 is elongated in a direction in parallel with a side of the display section 52 adjacent to the hole 50. In order to facilitate the understanding, in FIG. 2, the area in which the lower electrode 31, the auxiliary electrode 32, and the electrode plate 33 are provided is illustrated in the right-downward hatching, the area in which the bank 36 is formed is illustrated in the right-upward hatching.

The holes 50 are open in a width corresponding to the interval between the lower electrode 31 and the auxiliary electrode 32, for example. The length of the holes 50 except for the peripheral portion of the feeder 28 is substantially identical to the length of the lower electrode 31 in longitudinal direction (vertical direction of the drawing).

Figure 3:
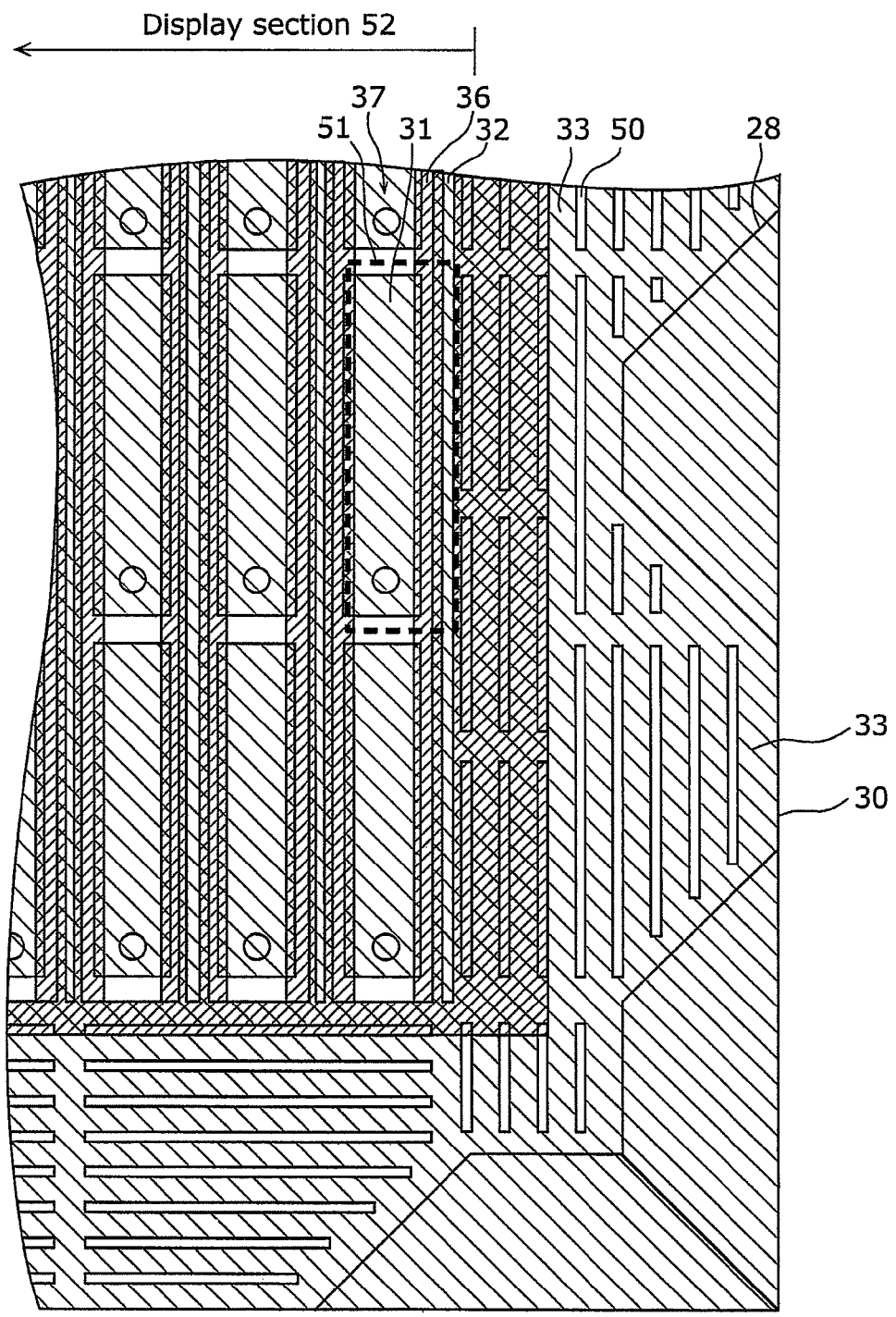
FIG. 3 is an enlarged planar view illustrating an example of the configuration of the display panel apparatus according to Embodiment 1 of the present invention.

Note that, although the shape of the feeder 28 at the peripheral portion is triangle in Embodiment 1, it is not limited to this example. For example, as illustrated in FIG. 3, the shape of the feeder 28 may be a trapezoid with the upper parallel side facing the display section 52.

(Detailed Configuration of Display Panel Apparatus)

The following shall describe the detailed configuration of the display panel apparatus 1 according to Embodiment 1 of the present invention with reference to FIGS. 4 to 7.

Note that, the configuration of the display panel apparatus 1 illustrated in FIGS. 4 to 7 is a representative example, and the display panel apparatus 1 is not limited to this example. The same reference numerals are assigned to the components described in FIGS. 1 and 2, and the description for these components is omitted where appropriate.

Figure 4:
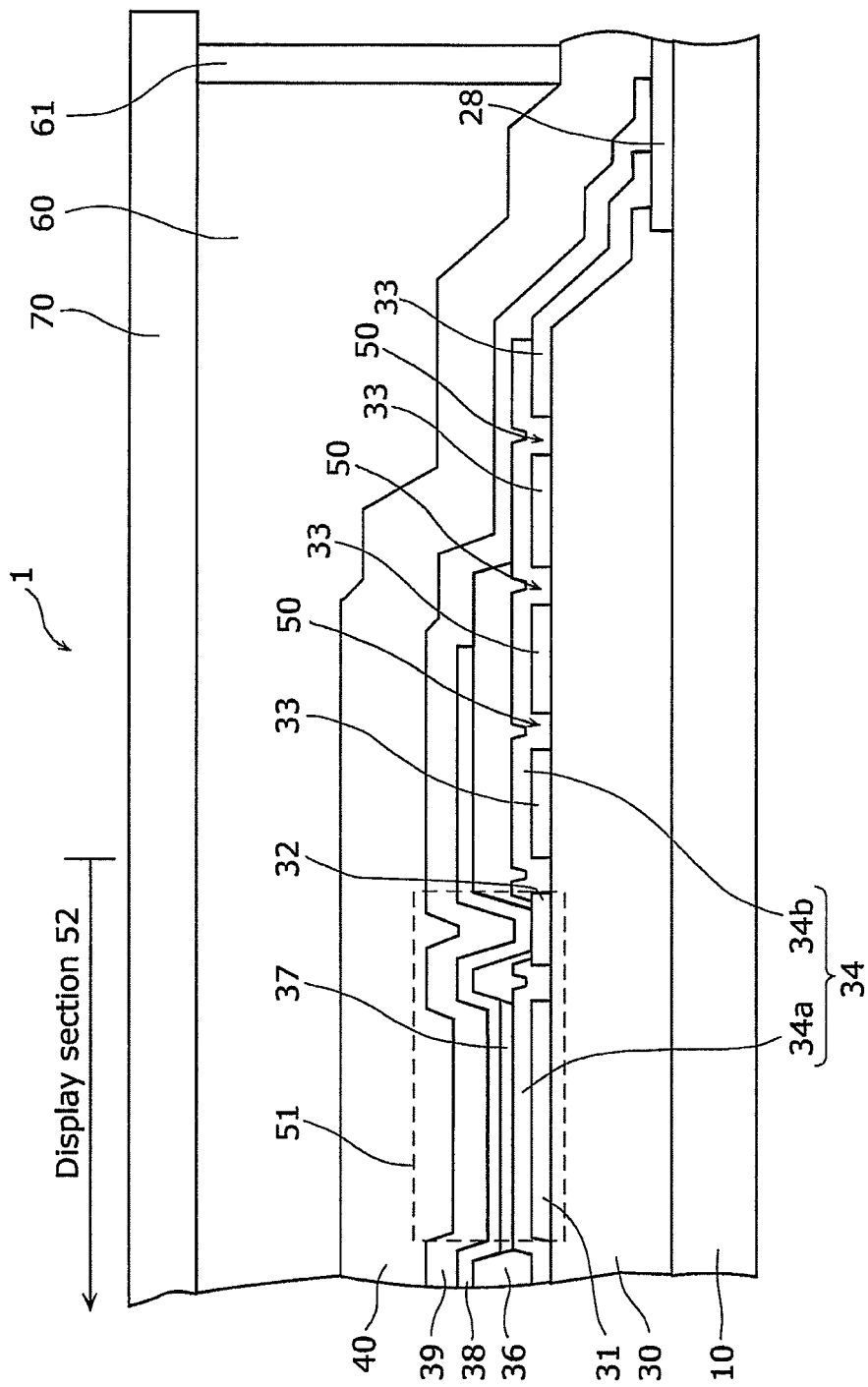
FIG. 4 is an AA' cross-sectional view illustrating an example of the configuration of the display panel apparatus according to Embodiment 1 of the present invention.

First, the cross-sectional structure of the display panel apparatus 1 in FIG. 2 along the line AA' shall be described. FIG. 4 is a cross-sectional view illustrating a cross-sectional surface of the display panel apparatus 1 along the line AA' in FIG. 2.

As illustrated in FIG. 4, in AA' cross-section in FIG. 2, the planarizing film 30 for planarizing the upper surface of the TFT layer 20 which shall be described later is formed on the upper surface of the substrate 10.

Above the planarizing film 30 in the display section 52, the lower electrode 31 separated for each pixel 51 and each of which is used as the anode, the auxiliary electrode 32 formed separately from the lower electrode 31, the electrode plate 33 electrically connected to the auxiliary electrode 32, the hole injection layer 34 made of inorganic material with hole-transporting property, the bank 36 made of photosensitive resin, the organic EL layer 37 made of organic material with electroluminescent property, the electron transport layer 38 made of organic material with electron transporting property, the upper electrode 39 arranged opposite to the lower electrode 31, made of conductive material, and used as the cathode, and a sealing film 40 made of insulating material are sequentially provided. Note that, the organic EL layer 37 includes organic luminescent material.

The lower electrode 31, the auxiliary electrode 32 and the electrode plate 33 are formed in the same layer on the planarizing film 30. More specifically, the lower electrode 31, the auxiliary electrode 32, and the electrode plate 33 are formed in the same process, which shall be described later.

The glass substrate 70 is provided above the sealing film 40 via the sealing member 61, and the gap between the sealing film 40 and the glass substrate is filled with a resin layer 60.

The electrode plate 33 with holes 50 is formed on the planarizing film 30 outside the display section 52. The electrode plate 33 is formed to cover the planarizing film 30 outside of the display section 52, and the holes 50 in the electrode plate 33 are formed to expose part of the surface of the planarizing film 30, and the holes 50 are for discharging the component such as moisture and acid inside of the planarizing film 30. The electrode plate 33 is provided outside of the display section 52, and is electrically connected to the feeder 28 in a region in which the planarizing film 30 is not formed. The electrode plate 33 is also electrically connected to the upper electrode 39 in a region outside of the display section 52 and in which the bank 36 is not formed.

As described above, the holes 50 are open in a width corresponding to the interval between the lower electrode 31 and the auxiliary electrode 32, for example.

Furthermore, the hole injection layer 34 as the functional layer of the pixel 51 is formed on the electrode plate 33 to close all of the holes 50 in the electrode plate 33, and part of the hole injection layer 34 extends to outside of the display section 52. More specifically, the hole injection layer 34 in Embodiment 1 has a first portion 34a as a functional layer located in the pixel 51 and between the lower electrode 31 and the organic EL layer 37, and a second portion 34b formed extending from the first portion 34a as the functional layer to outside of the display section 52. Subsequently, the second portion 34b of the hole injection layer 34 is formed to cover the holes 50 in the electrode plate 33, and the holes 50 are filled with the material of the hole injection layer 34. As such, the holes 50 in the electrode plate 33 are closed using the hole injection layer 34 made of inorganic material. More specifically, the second portion 34b of the hole injection layer 34 filling the holes 50 is part of the hole injection layer 34 provided between the lower electrode 31 and the organic EL layer 37 in the pixel 51. Note that, on the second portion 34b in the hole injection layer 34, a part in which the bank 36, the electron transport layer 38, and the upper electrode 39 are sequentially formed, and a part in which the upper electrode 39 is directly formed exist.

Here, as the inorganic material of the hole injection layer 34, metal oxide, metal nitride, or metal oxynitride may be used. Alternatively, the hole injection layer 34 may be formed using at least one of Tungsten (W), Titanium (Ti), Molybdenum (Mo), Vanadium (V), and Gallium (Ga).

The display panel apparatus 1 according to Embodiment 1 includes the holes 50 in the electrode plate 33. Thus, in the method of fabricating the display panel apparatus 1, the components such as moisture and acid included in the planarizing film 30 can be discharged at the same level inside the display section 52 which is a region in which the pixel 51 originally with opening is formed and outside of the display section 52 in which the holes 50 are formed in the electrode plate 33. For this reason, it is possible to prevent the excess moisture and acid sealed in the planarizing film 30 in a region outside of the display section 52.

Furthermore, in the display panel apparatus 1 according to Embodiment 1, the holes 50 in the electrode plate 33 is covered by the hole injection layer 34 made of the inorganic material. Thus, in the fabrication process after the holes 50 are closed, it is possible to prevent the foreign material such as moisture and acid from entering the planarizing film again through the holes 50.

Next, the cross-sectional structure of the display panel apparatus 1 in FIG. 2 along the line BB' shall be described. This cross-section includes the TFT layer 20 and the pixel regulating layer 35. Note that, in FIG. 5, the number of the holes 50 does not match the number of the holes 50 illustrated in FIG. 2.

Figure 5:
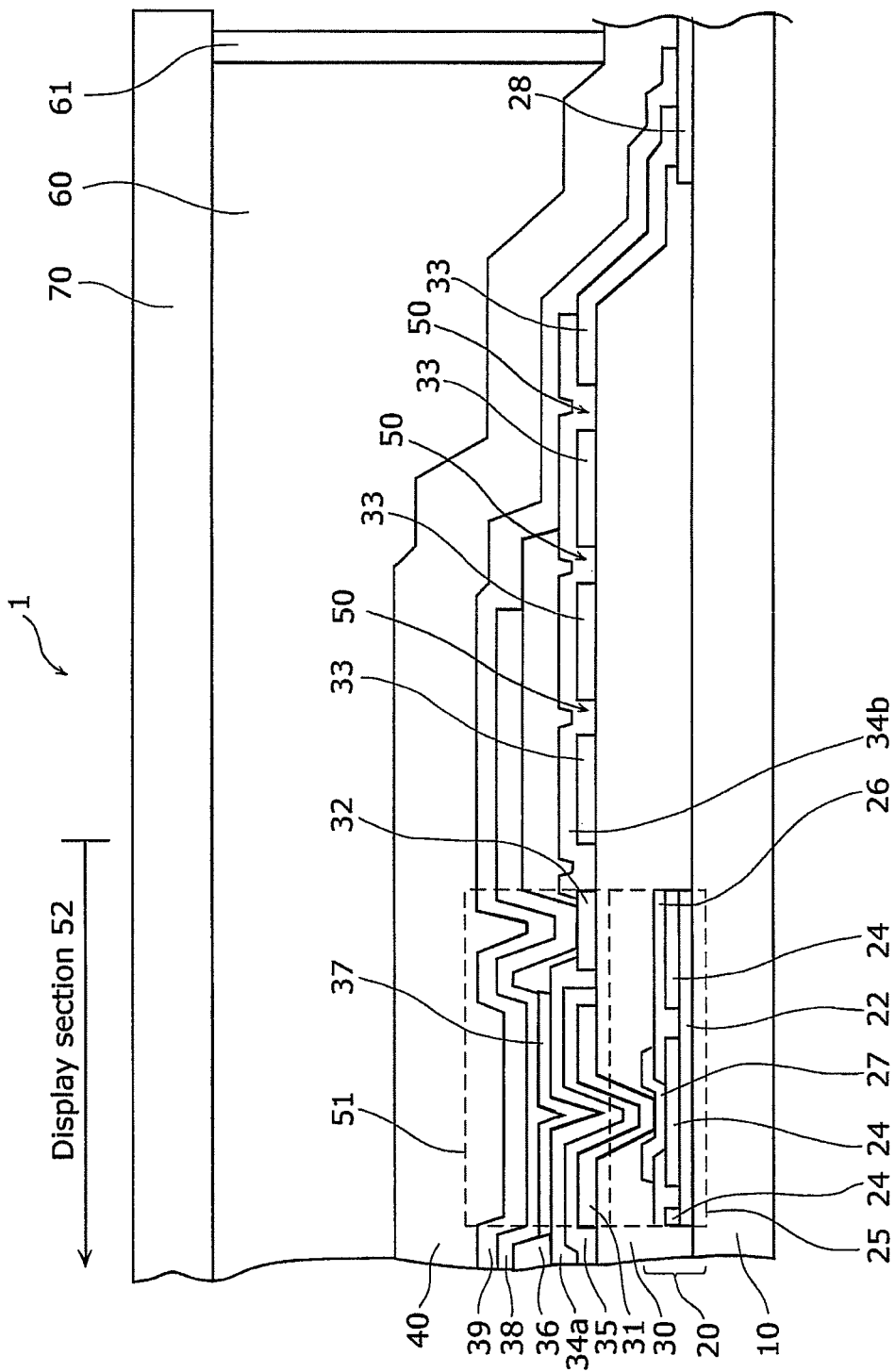
FIG. 5 is a BB' cross-sectional view illustrating an example of the configuration of the display panel apparatus according to Embodiment 1 of the present invention.

FIG. 5 is a cross-sectional view illustrating a cross-sectional surface of the display panel apparatus 1 along the line BB' in FIG. 2. As illustrated in FIG. 5, in BB' cross-section in FIG. 2, the driving device 25 which is a thin-film transistor including the gate insulating film 22 and the source-drain electrode 24, an interlayer insulating film 26, and an Indium Tin Oxide (ITO) film 27 are provided above the substrate 10. Note that, although not illustrated in the cross-section of FIG. 5, the driving device 25 includes other configuration generally necessary as thin-film transistor such as a gate electrode and a semiconductor film in a separate cross-section. The driving device 25 forms a driver circuit with a selection device which is another thin-film transistor and a capacitor for holding luminance voltage that are not illustrated. A region in which the driver circuit is provided between the substrate 10 and the planarizing film 30 is referred to as a TFT layer 20.

The planarizing film 30 for planarizing the upper surface of the TFT layer 20 is provided between the pixel 51 and the TFT layer 20.

The lower electrode 31 is electrically connected to the source-drain electrode 24 in the driving device 25 through the contact hole provided through the planarizing film 30 and the interlayer insulating film 26. Furthermore, in a region in the display section 52 and in which the bank 36 is not provided, the upper electrode 39 is electrically connected to the auxiliary electrode 32 through the electron transport layer 38.

As described above, the electrode plate 33 is formed to cover the planarizing film 30 outside of the display section 52, and includes holes 50 for exposing part of the surface of the planarizing film 30 so as to discharge the moisture and acid in the planarizing film 30. The electrode plate 33 is provided outside the display section 52, and is electrically connected to the feeder 28 in a region in which the planarizing film 30 is not formed. The electrode plate 33 is also electrically connected to the upper electrode 39 in a region outside the display section 52 and in which the bank 36 is not formed.

The pixel regulating layer 35 is provided between the lower electrode 31 and the first portion 34a in the hole injection layer 34. The pixel regulating layer 35 is made of insulating material, and regulates the light-emitting region by covering undesired portion of the lower electrode 31. Furthermore, by covering the lower electrodes 31 adjacent in the belt-shaped region partitioned by the bank 36 illustrated in FIGS. 2 and 3 with the pixel regulating layer 35, the adjacent pixels 51 can be partitioned. Note that, in Embodiment 1, it is not necessary to provide the pixel regulating layer 35.

Figure 6:
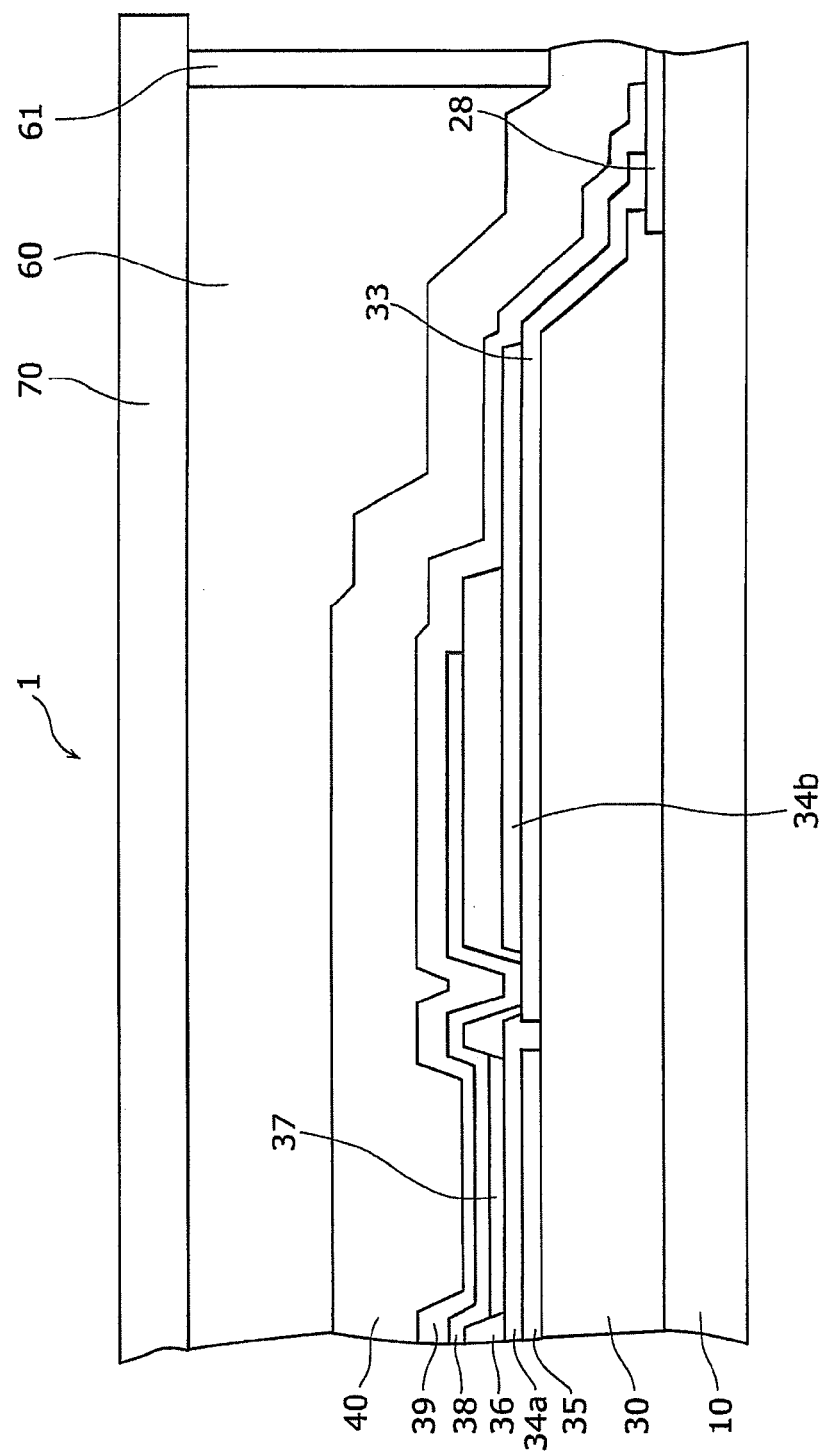
FIG. 6 is a CC' cross-sectional view illustrating an example of the configuration of the display panel apparatus according to Embodiment 1 of the present invention.

FIG. 6 is a cross-sectional view illustrating a cross-sectional surface of the display panel apparatus 1 along the line CC' in FIG. 2. As illustrated in FIG. 6, in CC' cross-section in FIG. 2, the lower electrode 31 and the holes 50 in the electrode plate 33 do not appear, in the cross-section at the end portion of the pixel 51.

As illustrated in FIG. 6, in the display section 52, the pixel regulating layer 35, the first part 34a of the hole injection layer 34, the organic EL layer 37, the electron transport layer 38 and the upper electrode 39 are sequentially formed in this order on the planarizing film 30. Outside of the display section 52, the second portion 34b of the hole injection layer 34 is formed to cover the electrode plate 33 on the planarizing film 30.

Next, the cross-sectional structure of the display panel apparatus 1 in FIG. 2 along the line DD' shall be described.

Figure 7:
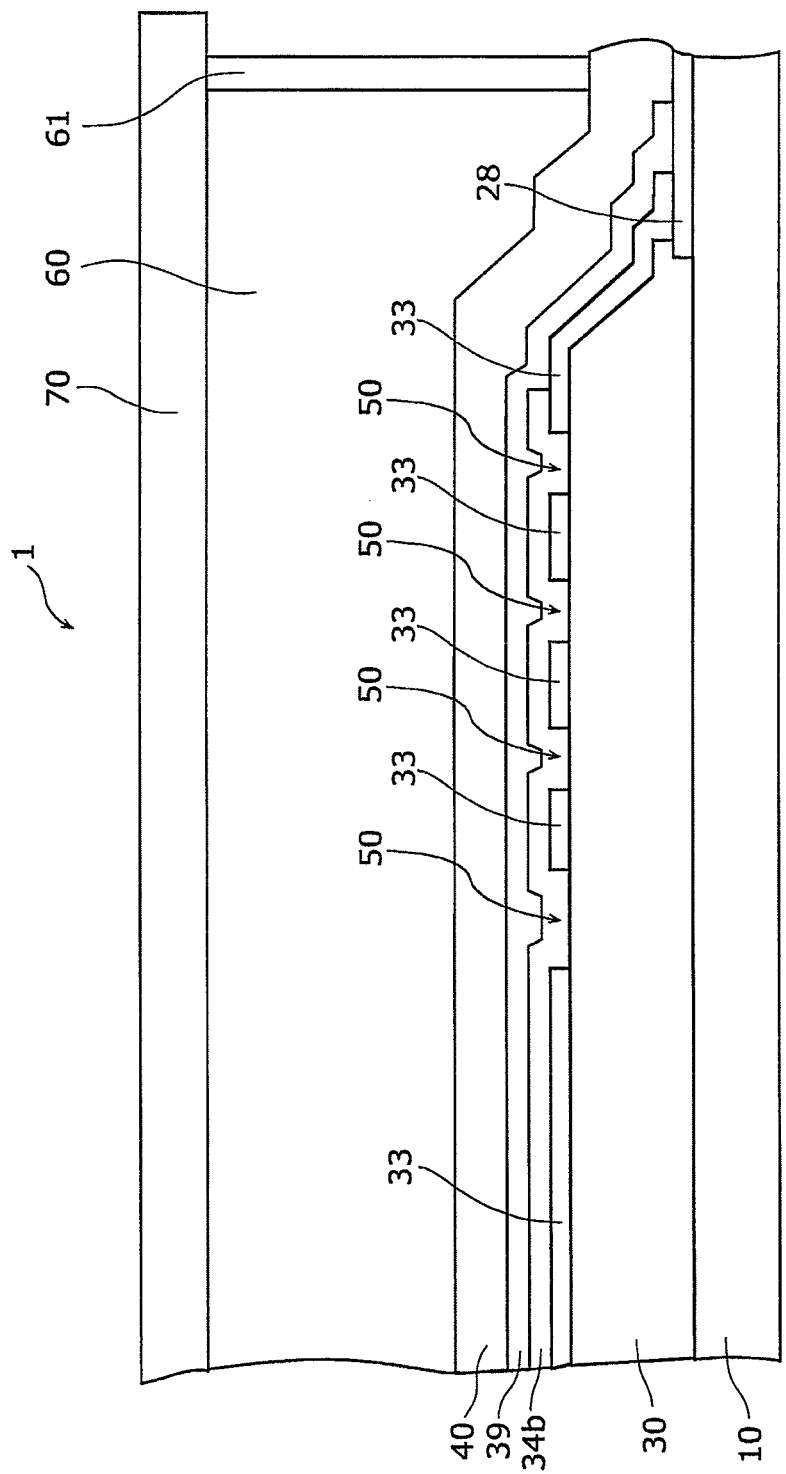
FIG. 7 is a DD' cross-sectional view illustrating an example of the configuration of the display panel apparatus according to Embodiment 1 of the present invention.

FIG. 7 is a cross-sectional view illustrating a cross-sectional surface of the display panel apparatus 1 along the line DD' in FIG. 2. As illustrated in FIG. 7, in the DD' cross-section in FIG. 2, and, the lower electrode 31, the auxiliary electrode 32, the hole injection layer 34, the organic EL layer 37, and the electron transport layer 38 do not appear in the cross-section outside of the display section 52.

As illustrated in FIG. 7, on the electrode plate 33, the second portion 34b of the hole injection layer 34 is formed to close the holes 50 in the electrode plate 33. The upper electrode 39 is formed above the second portion 34b of the hole injection layer 34.

The display panel apparatus 1 according to Embodiment 1 of the present invention with the configuration described above has holes 50 in the electrode plate 33 covering the planarizing film 30. With this, even if the planarizing film 30 with the components such as moisture and acid absorbed inside is covered by the electrode plate 33, the components such as moisture and acid included in the planarizing film 30 is outgassed through the holes 50.

Accordingly, if the pixel 51 is stacked on the planarizing film 30 with the moisture and acid included, the components such as moisture and acid included in the planarizing film 30 leaks to the organic layer (refers to the stacked structure of the organic EL layer 37 and the electron transport layer 38. Note that, a hole transport layer made of organic material may be formed on the hole injection layer 34 and this hole transport layer may be included), degrading the quality of the organic layer due to the reaction with the components such as moisture and acid. However, as described above, the components such as moisture and gas included in the planarizing film 30 is outgassed through the holes 50, preventing the degradation in the quality of the organic layer. As a result, it is possible to prevent the uneven display at the peripheral portion, and to prevent the pixels from being shrunk. In particular, when the organic layer includes Ba, the moisture reacts with the Ba, and Ba oxidized by moisture shrinks the pixels and turns the peripheral portion white. These problems can also be prevented.

In addition, gas components such as moisture and acid sealed in the planarizing film 30 is discharged. Thus, it is possible to prevent the electrode plate 33 from peeled off by the gas pressure of the gas component.

Furthermore, the display panel apparatus 1 according to Embodiment 1 of the present invention has the holes 50 in the electrode plate 33 covered with the inorganic material layer made of inorganic material. With this, in the fabrication process after the holes 50 are closed, it is possible to prevent the foreign material such as moisture and acid from entering the planarizing film 30 again through the holes 50. Accordingly, it is possible to prevent the degradation in the quality of the organic layer and the peeling of the electrode plate 33 caused by the re-entrance of the foreign material such as moisture and acid. Furthermore, it is possible to prevent the planarizing film from being eroded by moisture and acid remaining in the planarizing film.

(Consideration Regarding Shape of Holes)

By comparing the electric resistance of the electrode plates including different shapes of holes, the inventors found out that the shape of the holes 50 illustrated in FIG. 2 is good for not interrupting the flow of the driving current in the electrode plate 33. The following shall describe details of the consideration.

Figure 8A:
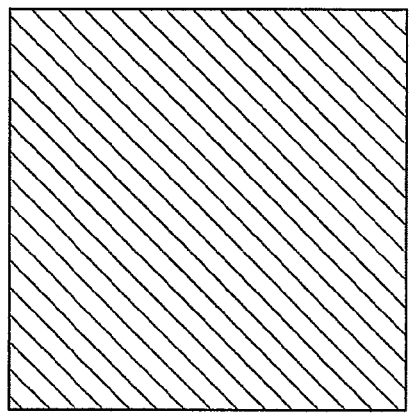
FIGS. 8A to 8D are diagrams illustrating examples of electrode plates used for the comparison of electric resistance.
Figure 8B:
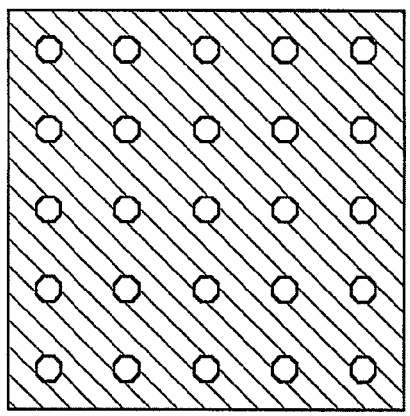
Figure 8C:
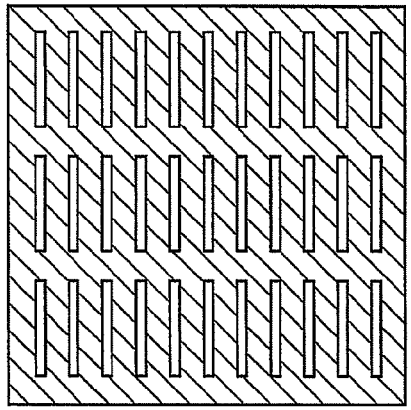
Figure 8D:
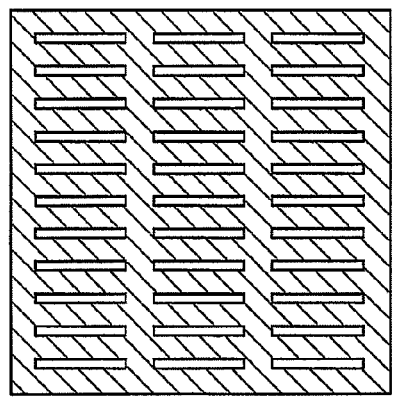

FIGS. 8A to 8D are diagrams illustrating examples of the shape of the electrode plates used for the comparison of electric resistance. All of the electrode plates have the same square shape and the same thickness. FIG. 8A illustrates the electrode plate with no hole. FIG. 8B illustrates octagon holes (aperture ratio 10%). FIG. 8C illustrates rectangular holes elongated in a direction orthogonal to the direction of current (aperture ratio 9%). FIG. 8D illustrates rectangular holes elongated in a direction in parallel with the current direction (aperture ratio 9%).

By simulation, a resistance value is calculated from a current value when a predetermined voltage is applied to a left side and a right side of the electrode plate, and the calculated resistance value is normalized by the resistance value of FIG. 8A. The resistance values (normalized values) of the electrode plates in FIGS. 8A to 8D are 1.0, 1.2, 1.9, and 1.1, respectively.

The results show that the rectangular holes elongated in the current direction is effective for suppressing the increase in the electric resistance in the electrode plate.

Next, based on the practical condition for the electrode plate 33, it is considered whether the increase in the electric resistance falls within an acceptable range when rectangular holes elongated in the current direction are provided. As the practical condition, the thickness of 0.15 µm, and the resistivity of 5.55E-8 Ωm are used.

Figure 9A:
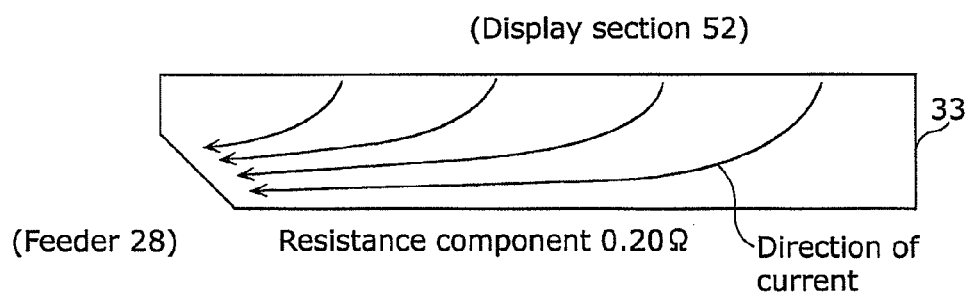
FIGS. 9A and 9B are diagrams for illustrating the effect of the holes in the electrode plates in practical use.
Figure 9B:
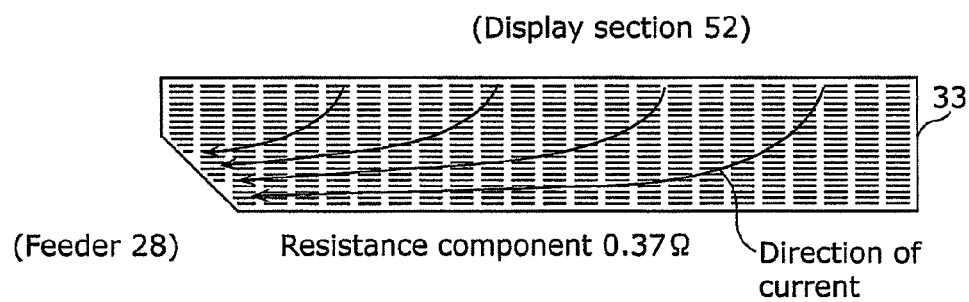

FIGS. 9A and 9B are drawings illustrating part of the electrode plates 33 that are actually used with the holes 50 and without the hole 50. The current distribution and resistance component in the electrode plates 33 are analyzed using the finite element method. The arrows roughly indicate the current direction which is the analysis result. Note that, each of the electrode plates 33 have an upper side connected to the auxiliary electrode 32 toward the display section 52, and the lower left oblique side connected to the feeder 28. As illustrated in FIGS. 9A and 9B, the current flowing from the connecting part of the auxiliary electrode 32 and the electrode plate 33 flows into the feeder 28. Here, the direction of the current transitions to a direction which is along a direction in parallel with the side of the display region in the vicinity of the holes as the current moves closer to the feeder 28.

As illustrated in FIG. 9A, when there is no hole, the current flowing into the upper side of the electrode plate 33 from the display section 52 flows to the feeder 28 from the left lower oblique side of the electrode 33, and is received at the oblique side of the triangle or the side edge of the trapezoid of the feeder 28. The resistance component of the electrode plate 33 in this case is 0.20Ω.

As illustrated in FIG. 9B, when the rectangle holes 50 elongated in a direction in parallel with the adjacent side of the display section 52 are provided in the electrode plate 33, the current in the electrode plate 33 does not significantly interfered compared to the case in which there is no hole. The current flows from the display section 52 to the feeder 28 along the holes 50, and is received at the oblique side of the triangle or the side edge of the trapezoid of the feeder 28. The resistance component of the electrode plate 33 in this case is 0.37 Ω.

The resistance component of the electrode plate 33 when there are holes 50 is confirmed to fall within an acceptable range for supplying the necessary current to the display section 52 under the condition estimated by the inventors with respect to the voltage drop in the power supply and the light-emitting efficiency of the organic EL device.

According to this aspect, the holes 50 are open along the current flow between the connecting part of the auxiliary electrode 32 and the electrode plate 33, and the feeder 28. With this, the holes 50 are adjusted to the direction of the current flow. Thus, it is possible to prevent the holes 50 from becoming the resistance of the current flow, suppressing the change in the resistance value.

More specifically, the holes 50 are open in rectangular shape elongated in a direction in parallel with the side of the display region adjacent to the holes 50. With this, the rectangular shape of the opening of the holes 50 is approximated to the direction of the current flow. Thus, it is possible to suppress the opening of the holes from becoming the resistance against the current flow, suppressing the change in the resistance value.

Furthermore, as illustrated in FIGS. 1 and 2, the feeder 28 may have a trapezoid shape with the upper side facing toward the display section 52, for example. The feeder 28 receives current flown from the display section 52 along the holes 50 at the side edge of the trapezoid. With this, it is possible to receive the current using the side edge of the trapezoid without increasing the area of the feeder 28. Accordingly, it is possible to maintain the area of the feeder 28 relatively small, allowing effective current supply.

The same applies to the case in which the feeder 28 is a triangle with a vertex pointed toward the display section 52, and the current flowing from the display section along the holes is received by the side of the triangle.

(Fabrication Method for Display Panel Apparatus 1)

Next, the method of fabricating the display panel apparatus 1 according to Embodiment 1 of the present invention shall be described.

The method of fabricating the display panel apparatus 1 according to Embodiment 1 of the present invention is characterized by a process for providing holes in a preferred shape in the electrode plate on the planarizing film, a process for outgassing the planarizing film through the holes, and a process for covering the holes with an inorganic material layer made of inorganic material.

The method of fabricating the display panel apparatus 1 according to Embodiment 1 of the present invention shall be described in detail with reference to the drawings.

Figure 10:
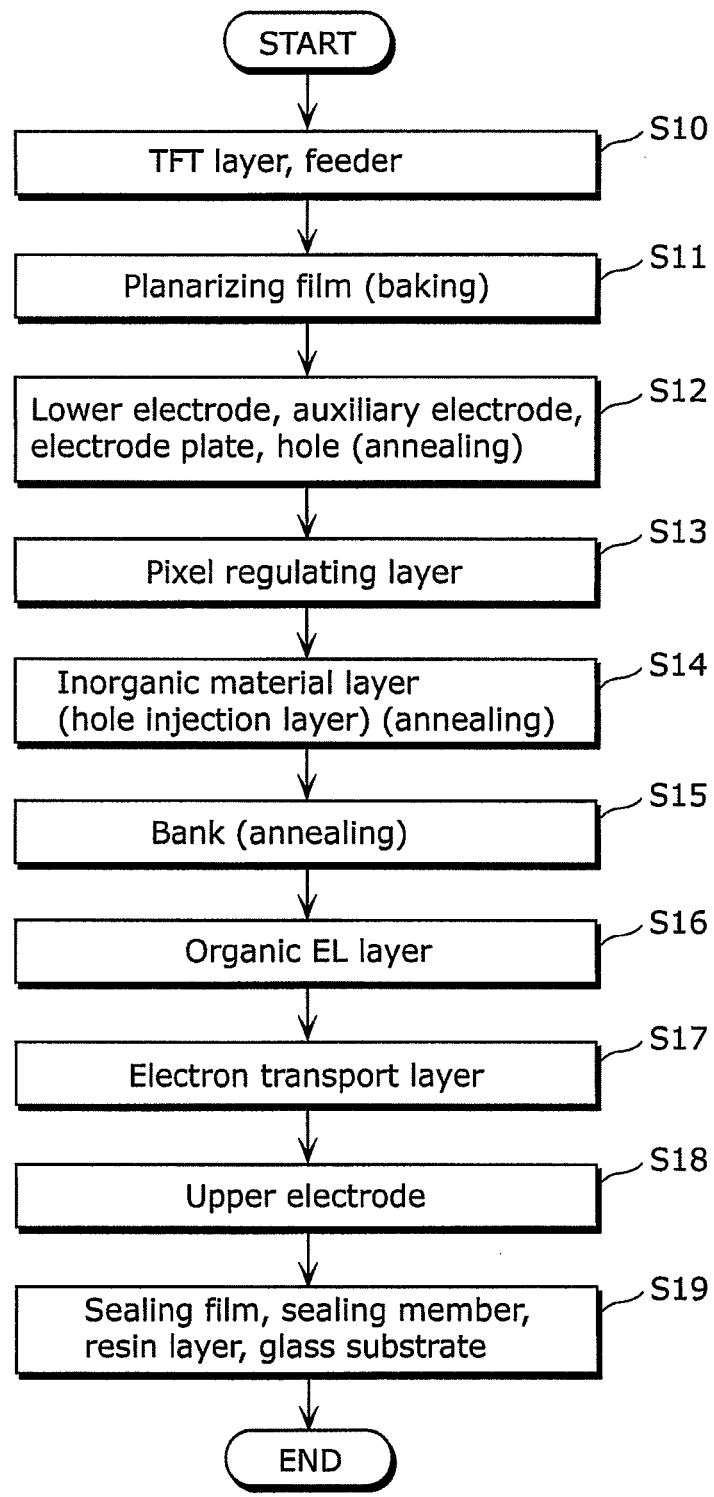
FIG. 10 is a flowchart illustrating the fabrication process of the display panel apparatus according to Embodiment 1 in the present invention.

FIG. 10 is a flowchart illustrating an example of the fabrication process of the display panel apparatus 1 according to Embodiment 1 in the present invention. The example in which the display panel apparatus 1 described above is fabricated shall be described based on FIG. 10 and with reference to FIGS. 2 and 5.

Note that, the following processes can be performed using the known processing technologies. Thus, detailed description for the processing conditions shall be omitted where appropriate. In addition, the material and process described below are merely typical examples, and the display panel apparatus and the method of fabricating the display panel apparatus according to the present invention are not limited to the example. The present invention includes a case in which other materials and processes which are known as appropriate are used. This applies to the method of fabricating the display panel apparatuses 2 and 3 according to Embodiments 2 and 3 which shall be described later.

(TFT Layer Forming Process)

First, the TFT layer 20 including the driving device 25 and the feeder 28 is formed by forming and patterning a semiconductor film, an insulating film, and a metal film on the main surface of the substrate 10 made of glass or plastic (510: first process).

(Planarizing Film Forming Process)

Next, by applying insulating organic material such as polyimide resin by spin coating or nozzle coating on an entire surface and baking the surface, the planarizing film 30 is formed. The interlayer insulating film 26 and the planarizing film 30 formed above the source-drain electrode 24 of the driving device 25, and the planarizing film 30 formed above the feeder 28 are removed by photo etching (511: second process).

(Lower Electrode and Electrode Plate Forming Process)

Next, a metal film is formed above the planarizing film 30 by sputtering, and the metal film is patterned into the lower electrode 31, the auxiliary electrode 32, and the electrode plate 33 with the shape illustrated in FIG. 5 by photo etching. Here, the holes 50 reaching the planarizing film 30 underneath are formed in the electrode plate 33 such that part of the surface of the planarizing film 30 is exposed. Furthermore, the lower electrode 31, the auxiliary electrode 32, and the electrode plate 33 are annealed (S12: third process).

In this process, in the part in which the interlayer insulating film 26 and the planarizing film 30 are removed, the lower electrode 31 and the source-drain electrode 24 of the driving device 25 are electrically connected, and the electrode plate 33 and the feeder 28 are electrically connected. Furthermore, with this annealing thermal treatment, the components such as moisture and acid remaining in the planarizing film 30 is outgassed through the holes 50. With this annealing thermal treatment, the components such as moisture and acid in the planarizing film 30 are outgassed. Note that, in order to completely discharge the outgassing components such as moisture and acid in the planarizing film 30 under the electrode plate 33, another outgassing component discharging process in which a thermal treatment is performed at a predetermined temperature may be provided after the lower electrode and electrode plate forming process.

(Pixel Regulating Layer Forming Process)

Next, a film made of inorganic compounds such as SiO2, SiN, SiON, Al2O3, and AlN made of insulating inorganic material, or a film made of insulating organic material such as polyimide resin is formed on the lower electrode 31, and photo-etched to form the pixel regulating layer 35 (S13: eighth process).

(Inorganic Material Layer Forming Process (Hole Injection Layer Forming Process))

Next, the inorganic material layer is formed by depositing the inorganic material such as W, Ti, Mo, V, Ga inside and outside of the display section 52 by vapor deposition and annealing the inorganic material (S14: fourth process).

In this embodiment, the inorganic material layer is the hole injection layer 34. More specifically, in the display section 52, the inorganic material layer is formed above the pixel regulating layer 35 as the hole injection layer 34. On the other hand, outside of the display section 52, the inorganic material layer is formed on the electrode plate 33 to cover the holes 50 of the electrode plate 33.

Note that, immediately before the inorganic material layer forming process, another outgassing component discharging process in which a thermal treatment is performed at a predetermined temperature may be provided as a process for completely discharging the outgassing components such as moisture and acid in the planarizing film 30 under the electrode plate 33.

(Bank Forming Process)

Next, the banks 36 in a shape illustrated in FIGS. 2 and 3 for partitioning pixels are formed by applying photosensitive polyimide resin by spin coating and nozzle coating on the entire surface, and performing patterning by photolithography and annealing (S15: fifth process).

(Organic EL Layer Forming Process)

Next, the organic EL layer 37 is formed by placing functional fluid including organic material with electroluminescent property such as tris(8-hydroxyquinolinato)aluminium (Alq3) on the belt-shaped region partitioned by adjacent banks 36 by inkjet method, and drying the functional fluid (S16: sixth process).

(Electron Transport Layer Forming Process)

Next, the electron transport layer 38 is formed by depositing organic material made of oxadiazole derivatives and others by vacuum vapor deposition (S17: ninth process).

(Upper Electrode Forming Process)

Next, the upper electrode 39 is formed by depositing transparent conductive material such as Indium Tin Oxide or Indium Zinc Oxide by vacuum vapor deposition (S18: seventh process).

(Sealing Process)

Finally, the display panel apparatus 1 is complete by providing the sealing film 40, the resin layer 60, the sealing member 61, and the glass substrate 70 (S19: tenth process). Note that, instead of the glass substrate 70, a color filter substrate and others may be provided, for example.

As described above, according to the method of fabricating the display panel apparatus 1 according to Embodiment 1 of the present invention, the holes 50 for discharging components such as moisture and acid included in the planarizing film 30 are provided in the electrode plate 33 covering the planarizing film 30. With this, even if the planarizing film 30 with the components such as moisture and acid absorbed is covered by the electrode plate 33, the components such as moisture and acid included in the planarizing film 30 is discharged through the holes 50.

For this reason, the pixel 51 is stacked on the planarizing film 30 with this state, it is possible to prevent the components such as moisture and acid included in the planarizing film 30 from leaking the organic layer, degrading the organic layer due to the reaction with the outgassing afterwards. Consequently, it is possible to prevent the pixels from shrinking.

Furthermore, with the annealing before forming the inorganic material layer, it is possible to discharge the gas components such as moisture and acid sealed in the planarizing film 30 through the holes 50 in the electrode plate 33. With this, it is possible to prevent the electrode plate 33 from peeling off by the gas pressure of the gas component. Furthermore, it is possible to prevent the components such as moisture and acid from leaking the organic layer at the peripheral portion of the display section 52, causing uneven display at the peripheral portion and the peripheral portion turning white due to the reaction of the organic layer with the components such as acid and moisture.

Furthermore, by the method of fabricating the display panel apparatus 1 according to Embodiment 1 of the present invention, the holes 50 in the electrode plate 33 are covered by the inorganic material layer made of inorganic material. With this, in the fabrication process after the holes 50 are closed, it is possible to prevent the foreign material such as moisture and acid from entering the planarizing film 30 again through the holes 50. Accordingly, it is possible to prevent the degradation in the quality of the organic layer and the peeling of the electrode plate 33 caused by the re-entrance of the foreign material such as moisture and acid.

Note that, in the method of fabricating the display panel apparatus 1 according to Embodiment 1 of the present invention, the inorganic layer covering the holes 50 in the electrode plate 33 is formed by extending part of the hole injection layer 34 formed in the pixel 51. However, it is not limited to this example. For example, the holes 50 in the electrode plate 33 may be covered with another inorganic material other than the hole injection layer 34. In this case, the inorganic material layer is formed in the fabrication process different from the method of fabricating the hole injection layer 34. Furthermore, in this case, in order to discharge the components such as moisture and acid in the planarizing film, it is preferable that the thermal treatment is performed before the inorganic material layer is formed.

However, it is preferable that the inorganic material layer covering the holes 50 is formed using the hole injection layer 34 as in Embodiment 1. This is because, forming the inorganic layer covering the holes 50 using the hole injection layer 34 of the pixel 51 allows forming the hole injection layer 34 and the inorganic material layer covering the holes 50 in the same process, thereby simplifying the fabrication process and reducing the fabrication cost.

Embodiment 2

Next, the display panel apparatus 2 according to Embodiment 2 of the present invention shall be described with reference to the drawings. Note that, the same reference numerals are assigned to the components with the same function as the components in the display panel apparatus 1 according to Embodiment 1, and the description for these components is simplified or omitted.

The display panel apparatus 2 according to Embodiment 2 of the present invention is different from the display panel apparatus 1 according to Embodiment 1 in that the configuration of the electrode plate 33 covers the holes 50. More specifically, in the display panel apparatus 1 according to Embodiment 1 of the present invention, the holes 50 are covered by extending a part of the hole injection layer 34 made of inorganic material. In contrast, in the display panel apparatus 2 according to Embodiment 2 of the present invention, a part of the pixel regulating layer 35 made of inorganic material is extended to outside of the display section 52 to cover the holes 50.

Figure 11:
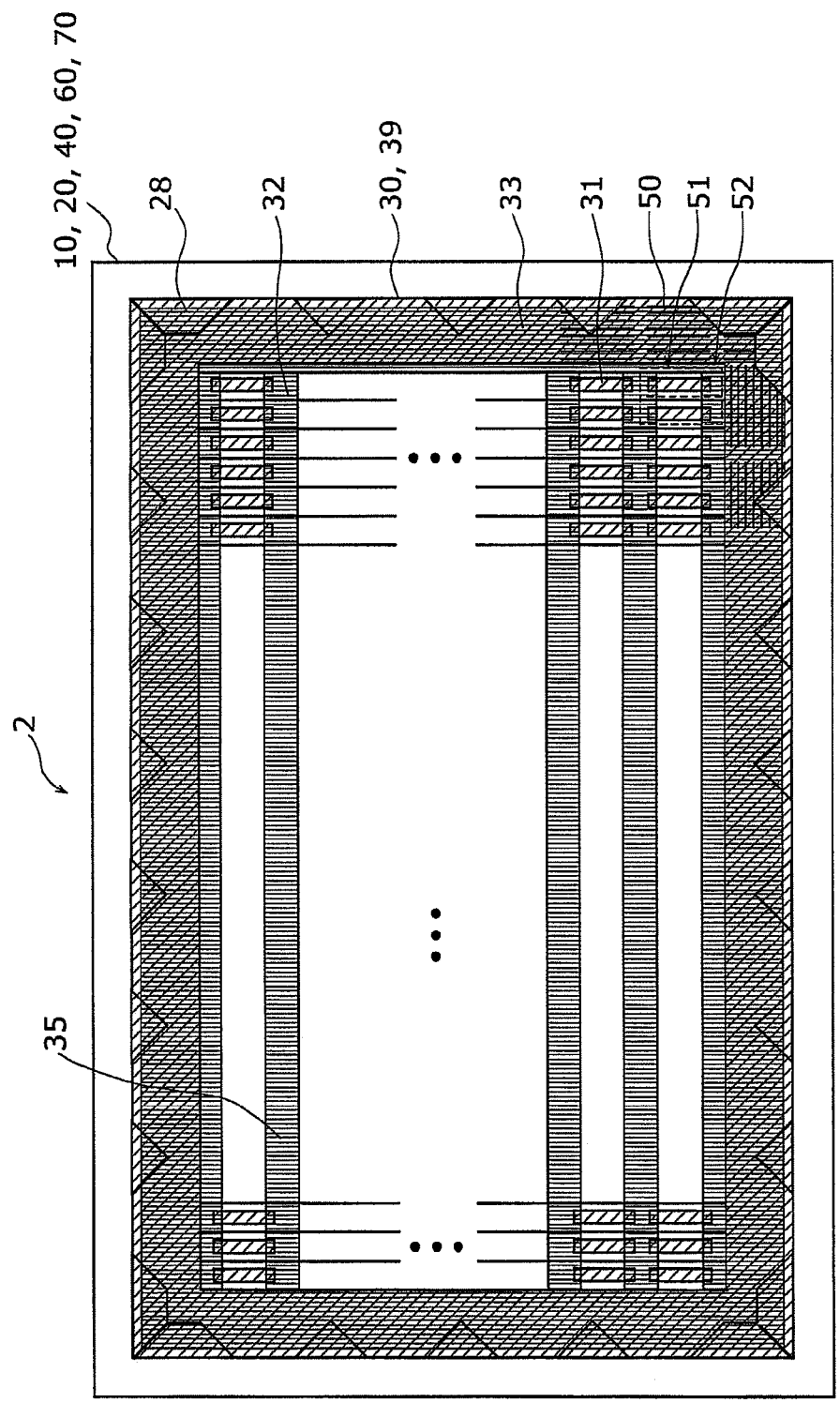
FIG. 11 is a planar view illustrating an example of the configuration of the display panel apparatus according to Embodiment 2 of the present invention.
Figure 12:
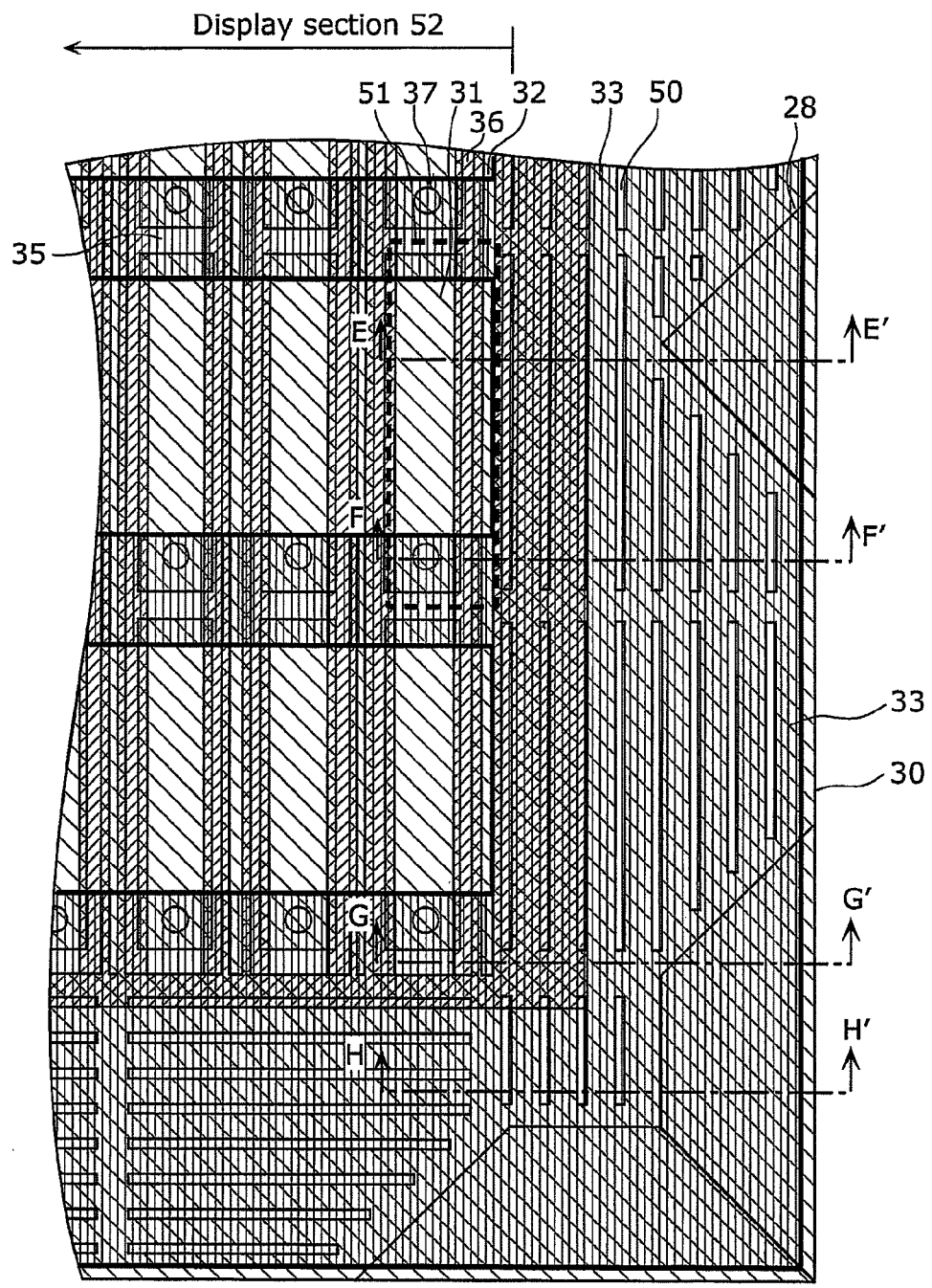
FIG. 12 is an enlarged planar view illustrating an example of the configuration of the display panel apparatus according to Embodiment 2 of the present invention.

FIG. 11 is a planar view illustrating an example of the configuration of the display panel apparatus according to Embodiment 2 of the present invention. FIG. 12 is an enlarged planar view illustrating details of the lower right corner of the display panel apparatus 2 illustrated in FIG. 11.

In the display panel apparatus 2 according to Embodiment 2 of the present invention, the pixel regulating layer 35 is formed in belt-shape to cover the peripheral portion of the adjacent pixels 51 in the vertical direction in row direction in the display section 52 (horizontal direction of the drawing). In addition, a part of the pixel regulating layer 35 extends to outside of the display section 52 to cover all of the holes 50 in the electrode plate 33. In order to facilitate the understanding, a range in which the pixel regulating layer 35 is formed is indicated by a vertical hatching in FIGS. 11 and 12.

The following shall describe a detailed configuration of the display panel apparatus 2 according to Embodiment 2 of the present invention with reference to FIGS. 13 to 16. Note that, the configuration of the display panel apparatus 2 illustrated in FIGS. 13 to 16 is a representative example, and the display panel apparatus 2 is not limited to this example.

First, the cross-sectional structure of the display panel apparatus 2 in FIG. 12 along the line EE' shall be described.

Figure 13:
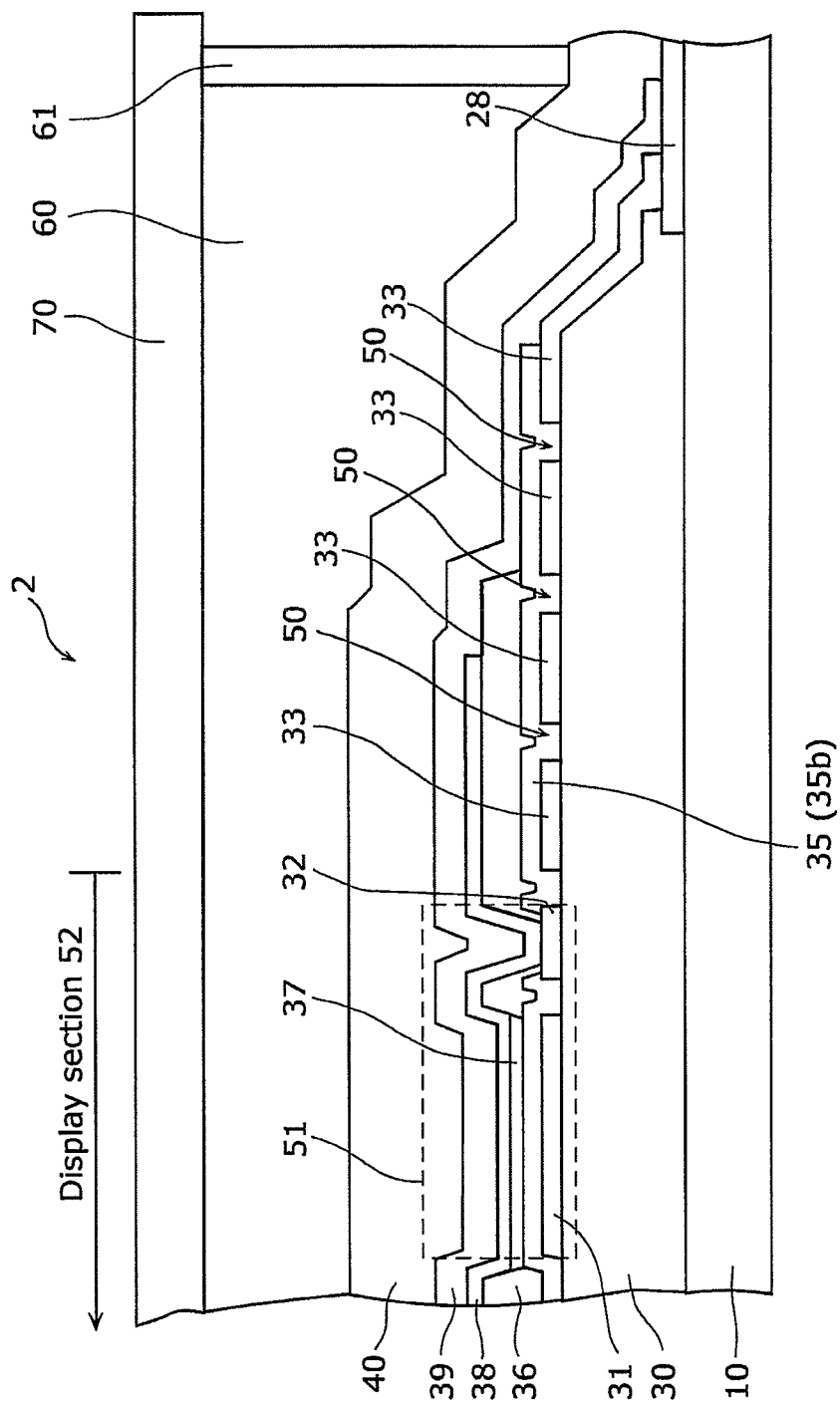
FIG. 13 is an AA' cross-sectional view illustrating an example of the configuration of the display panel apparatus according to Embodiment 2 of the present invention.

FIG. 13 is a cross-sectional view illustrating a cross-sectional surface of the display panel apparatus 2 along the line EE' in FIG. 12. Since the cross-sectional structure of the pixel 51 is identical to the structure illustrated in FIG. 4, detailed description for the cross-sectional structure is omitted.

As illustrated in FIG. 13, the electrode plate 33 including the holes 50 are formed above the planarizing film 30 outside of the display section 52. In Embodiment 2, on the electrode plate 33, a part of the pixel regulating layer 35 is formed to extend to outside of the display section 52 such that all of the holes 50 in the electrode plate 33 are covered. More specifically, the pixel regulating layer 35 in Embodiment 2 includes a first portion 35a located in the pixel 51 and serves as a functional layer provided between the planarizing film 30 and the lower electrode 31, and a second portion 35b formed extending from the first portion 35a as the functional layer to outside of the display section 52. In addition, the second portion 35b in the pixel regulating layer 35 covers the holes 50 in the electrode plate 33. As such, the holes 50 in the electrode plate 33 are closed using the pixel regulating layer 35 made of inorganic material. More specifically, the second portion 35b in the pixel regulating layer 35 filling the holes 50 is a part of the pixel regulating layer 35 provided between the lower electrode 31 and the organic EL layer 37 in the pixel 51. Note that, on the second portion 35b in the hole injection layer 35, a part in which the bank 36, the electron transport layer 38, and the upper electrode 39 are sequentially formed, and a part in which the upper electrode 39 is directly formed exist.

Here, the pixel regulating layer 35 may be formed with an insulating material. Alternatively, the pixel regulating layer 35 may be formed with metal oxide, metal nitride, or metal oxynitride. For example, SiO2, SiN, SiON, TiO2, TiN, Al2O3, AlN, and other material may be used. Alternatively, at least one of Silicon (Si), Chromium (Cr), and Titanium (Ti) may be used.

Figure 14:
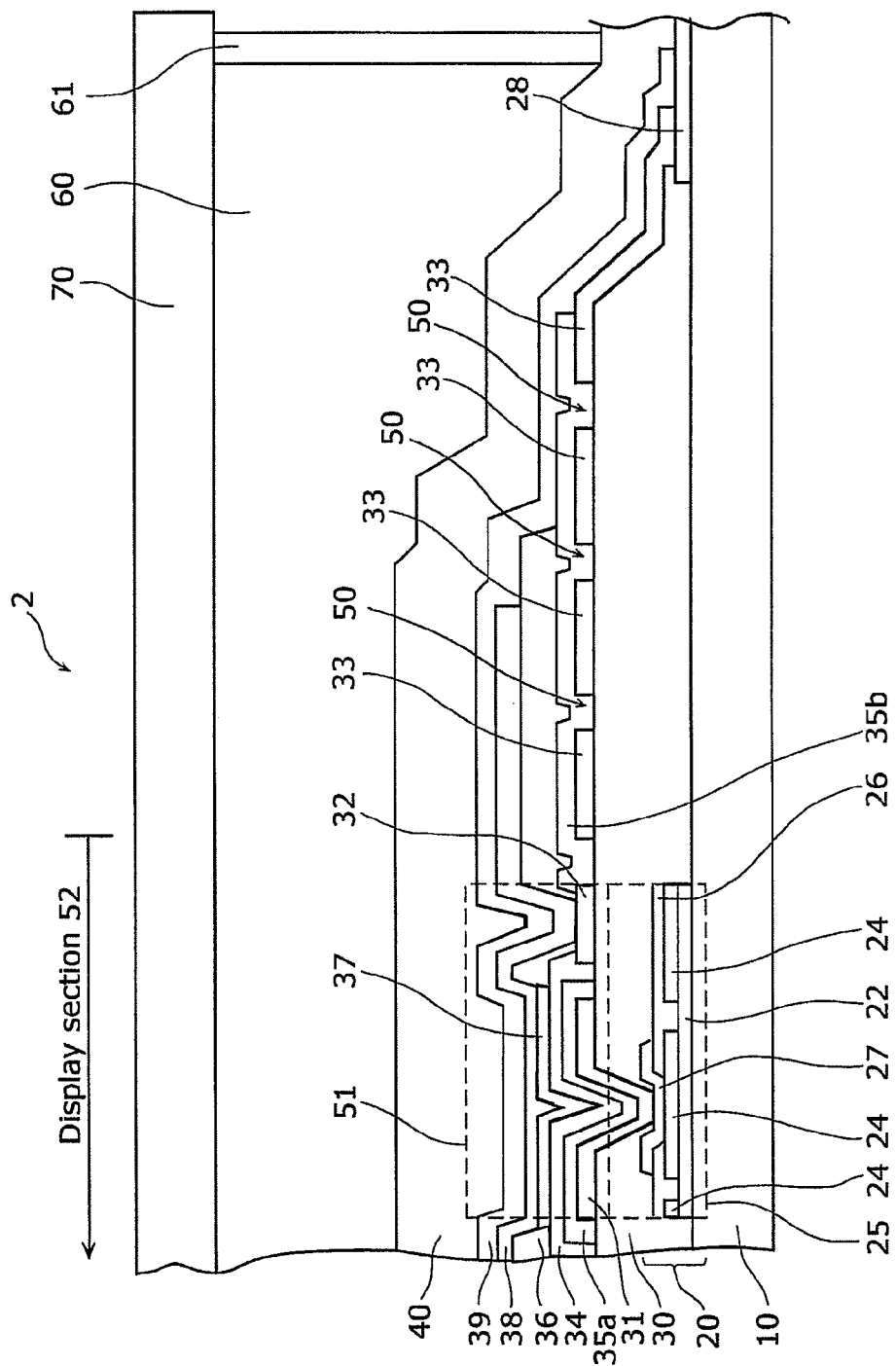
FIG. 14 is a BB' cross-sectional view illustrating an example of the configuration of the display panel apparatus according to Embodiment 2 of the present invention.
Figure 15:
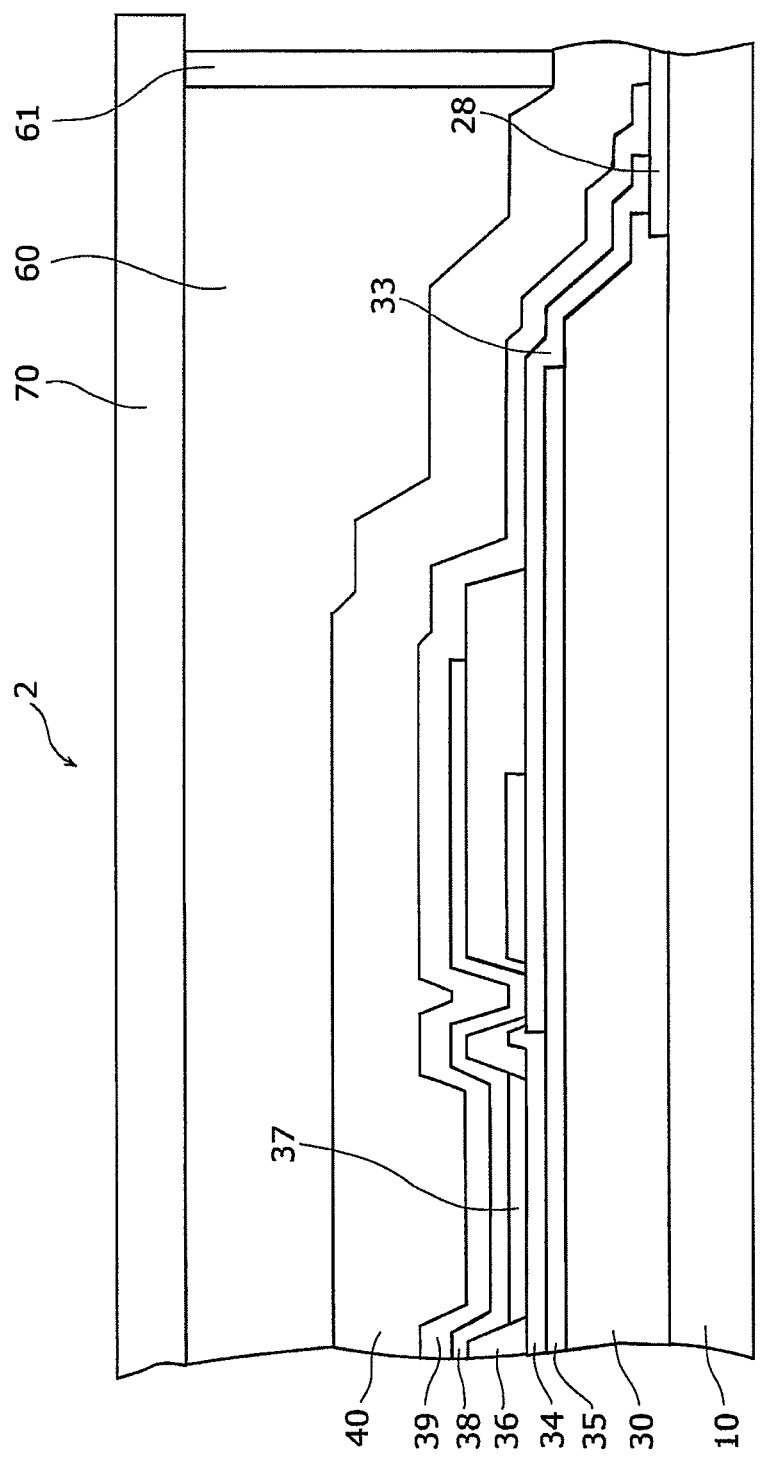
FIG. 15 is a CC' cross-sectional view illustrating an example of the configuration of the display panel apparatus according to Embodiment 2 of the present invention.
Figure 16:
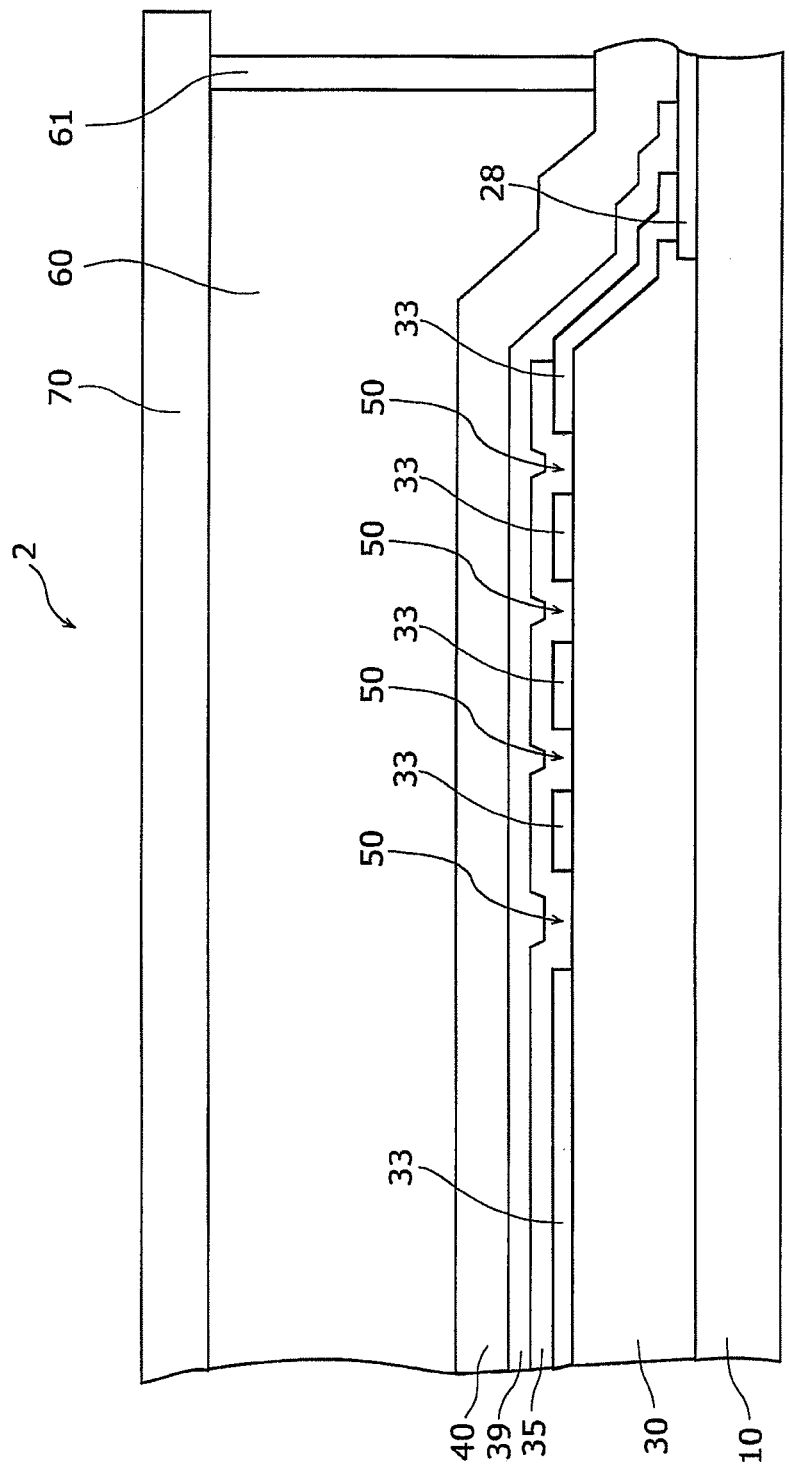
FIG. 16 is a DD' cross-sectional view illustrating an example of the configuration of the display panel apparatus according to Embodiment 2 of the present invention.

FIGS. 14 to 16 are cross-sectional views illustrating cross-sections of the display panel apparatus 2 along the lines FF', GG', and HH' illustrated in FIG. 12. Note that, since the cross-sectional structures of the display section 52 illustrated in FIGS. 14 to 16 are basically identical to the cross-sectional structures of the display section 52 illustrated in FIGS. 5 to 7, detailed descriptions for the cross-sectional structures shall be omitted here.

As illustrated in FIGS. 14 to 16, outside of the pixel 52, the second portion 35b of the pixel regulating layer 35 is formed to close the holes 50 in the electrode plate 33.

As described above, the display panel apparatus 2 according to Embodiment 2 of the present invention with the configuration described above has holes 50 in the electrode plate 33 covering the planarizing film 30. With this, even if the planarizing film 30 with the components such as moisture and acid absorbed is covered by the electrode plate 33, the components such as moisture and acid included in the planarizing film 30 is discharged through the holes 50. With this, it is possible to prevent the degradation in the quality of the organic layer due to the leak of the components such as moisture and acid to the organic layer. Furthermore, peeling off of the electrode plate 33 and uneven display at the peripheral portion and the peripheral portion turning white due to the reaction of the organic layer with the components such as acid and moisture can be prevented. Furthermore, it is possible to prevent the planarizing film from being eroded by moisture and acid remaining in the planarizing film.

Furthermore, the display panel apparatus 2 according to Embodiment 2 of the present invention has the holes 50 in the electrode plate 33 covered with the inorganic material layer made of inorganic material. With this, in the fabrication process after the holes 50 are closed, it is possible to prevent the foreign material such as moisture and acid from entering the planarizing film 30 again through the holes 50. Accordingly, it is possible to prevent the degradation in the quality of the organic layer and the peeling of the electrode plate 33 caused by the re-entrance of the foreign material such as moisture and acid.

Note that, the description on the shapes of the holes with reference to FIGS. 8 and 9 is applicable to the display panel apparatus 2 according to Embodiment 2 of the present invention.

Furthermore, in the display panel apparatus 2 according to Embodiment 2 of the present invention, the hole injection layer 34 is formed only in the display section 52. In this case, the hole injection layer 34 may be made of organic material, or the inorganic material used in the display panel apparatus 1 according to Embodiment 1 of the present invention.

(Fabrication Method for Display Panel Apparatus 2)

Next, the method of fabricating the display panel apparatus 2 according to Embodiment 2 of the present invention shall be described.

The method of fabricating the display panel apparatus 2 according to Embodiment 2 of the present invention is characterized by a process for providing holes in the electrode plate on the planarizing film, a process for discharging the components such as moisture and acid from the planarizing film through the holes, and a process for covering the holes with an inorganic material layer made of inorganic material. The method of fabricating the display panel apparatus 2 according to Embodiment 2 is different from the method of fabricating the display panel apparatus 1 according to Embodiment 1 in the following point. While the holes 50 are covered with the hole injection layer 34 made of inorganic material in the method of fabricating the display panel apparatus 1 according to Embodiment 1 of the present invention, in the method of fabricating the display panel apparatus 2 according to Embodiment 2, the holes 50 are covered by using the pixel regulating layer 35 made of inorganic material.

The following shall describe the method of fabricating the display panel apparatus according to Embodiment 2 of the present invention with reference to the drawings.

Figure 17:
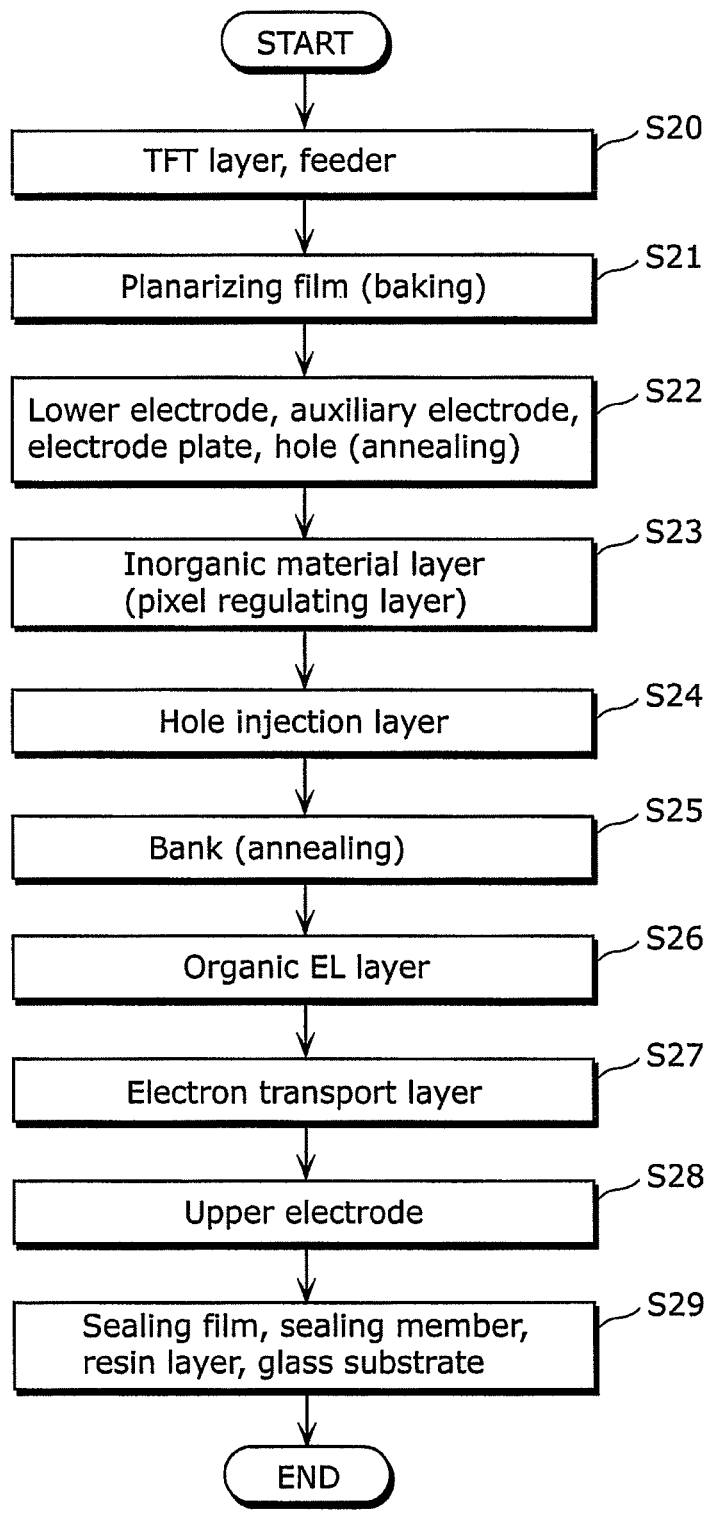
FIG. 17 is a flowchart illustrating the fabrication process of the display panel apparatus according to Embodiment 2 in the present invention.

FIG. 17 is a flowchart illustrating an example of the fabrication process of the display panel apparatus 2 according to Embodiment 2 in the present invention. The example in which the display panel apparatus 2 described above is fabricated shall be described based on FIG. 17 and with reference to FIGS. 12 and 14.

(TFT Layer Forming Process)

First, the TFT layer 20 including the driving device 25 and the feeder 28 is formed by forming and patterning a semiconductor film, an insulating film, and a metal film on the main surface of the substrate 10 made of glass or plastic (S20: first process).

(Planarizing Film Forming Process)

Next, by applying insulating organic material such as polyimide resin by spin coating or nozzle coating on an entire surface and baking the organic material, the planarizing film 30 is formed. The interlayer insulating film 26 and the planarizing film 30 formed above the source-drain electrode 24 of the driving device 25 and the planarizing film 30, and the planarizing film 30 formed above the feeder 30 are removed by photo etching (S21: second process).

(Lower Electrode and Electrode Plate Forming Process)

Next, a metal film is formed on the planarizing film 30 by sputtering, and the metal film is patterned into the lower electrode 31, the auxiliary electrode 32, and the electrode plate 33 with the shape illustrated in FIG. 15 by photo etching. Here, the holes 50 are formed in the electrode plate 33 exposing a part of the surface of the planarizing film. Furthermore, the lower electrode 31, the auxiliary electrode 32, and the electrode plate 33 are annealed (S22: third process).

In this process, in the part in which the interlayer insulating film 26 and the planarizing film 30 are removed, the lower electrode 31 and the source-drain electrode 24 of the driving device 25 are electrically connected, and the electrode plate 33 and the feeder 28 are electrically connected. Furthermore, with this annealing thermal treatment, the components such as moisture and acid remaining in the planarizing film 30 is outgassed through the holes 50. With this annealing thermal treatment, the components such as moisture and acid in the planarizing film 30 are outgassed. Note that, in order to completely discharge the outgassing components such as moisture and acid in the planarizing film 30 under the electrode plate 33, another outgassing component discharging process in which thermal treatment is performed at a predetermined temperature may be provided after the lower electrode and electrode plate forming process.

(Inorganic Material Layer Forming Process (Pixel Regulating Layer Forming Process))

Next, a film made of inorganic compound including insulating inorganic material such as $SiO_2$, SiN, SiON, $TiO_2$, TiN, $Al_2O_3$, AlN and others or a film made of metal such as Silicon (Si), Chromium (Cr), Titanium (Ti) and others above the lower electrode 31, and performing photo-etching (S23: fourth process).

In this embodiment, the inorganic material layer is the pixel regulating layer 35. More specifically, in the display section 52, the inorganic material layer is formed on the lower electrode 31 as the pixel regulating layer 35. The pixel regulating layer 35 is patterned into a predetermined belt-shape. In contrast, outside of the display section 52, the inorganic material layer is formed on the electrode plate 33 as a layer covering the holes 50 in the electrode plate 33.

Note that, immediately before the inorganic material layer forming process, another outgassing component discharging process in which thermal processing is performed at a predetermined temperature may be provided as a process for completely outgassing the components such as moisture and acid in the planarizing film 30 under the electrode plate 33.

(Hole Injection Layer Forming Process)

Next, the hole injection layer 34 is formed by depositing the hole injection layer 34 made of inorganic material such as W, Ti, Mo, V, and Ga in the display section 52 and annealing the deposited material (S24: eighth process).

Note that, the hole injection layer 34 may be formed with an organic material such as poly(3,4-ethylenedioxythiophene) (PEDOT). In this case, the hole injection layer 34 may be formed by applying PEDOT to a range in which the display section 52 is formed by inkjet method or nozzle coating, and annealing the applied material.

(Bank Forming Process)

Next, the banks 36 for partitioning pixels in a shape illustrated in FIG. 12 are formed by applying photosensitive polyimide resin by spin coating and nozzle coating on the entire surface, performing patterning by photolithography and annealing (S25: fifth process)

(Organic EL Layer Forming Process)

Next, the organic EL layer 37 is formed by placing functional fluid including organic material with electroluminescent property such as tris(8-hydroxyquinolinato)aluminium (Alq3) on the belt-shaped region partitioned by adjacent banks 36 by inkjet method, and drying the functional fluid (S26: sixth process).

(Electron Transport Layer Forming Process)

Next, the electron transport layer 38 is formed by depositing organic material made of oxadiazole derivatives and others by vacuum vapor deposition (S27: ninth process).

(Upper Electrode Forming Process)

Next, the upper electrode 39 is formed by depositing transparent conductive material such as Indium Tin Oxide or Indium Zinc Oxide by vacuum vapor deposition (S28: seventh process).

(Sealing Process)

Finally, the display panel apparatus 1 is complete by providing the sealing film 40, the resin layer 60, the sealing member 61, and the glass substrate 70 (S29: tenth process).

As described above, according to the method of fabricating the display panel apparatus 2 according to Embodiment 2 of the present invention, the holes 50 for discharging the components such as moisture and acid included in the planarizing film 30 are provided in the electrode plate 33 covering the planarizing film 30. With this, even if the planarizing film 30 with the components such as moisture and acid absorbed is covered by the electrode plate 33, the components such as moisture and acid included in the planarizing film 30 is discharged through the holes 50. With this, it is possible to prevent the degradation in the quality of the organic layer due to the leak of the components such as moisture and acid to the organic layer. Furthermore, peeling off of the electrode plate 33 and uneven display at the peripheral portion and the peripheral portion turning white due to the reaction of the organic layer with the components such as acid and moisture can be prevented.

Furthermore, by the method of fabricating the display panel apparatus 2 according to Embodiment 2 of the present invention, the holes 50 in the electrode plate 33 are covered by the inorganic material layer made of inorganic material. With this, in the fabrication process after the holes 50 are closed, it is possible to prevent the foreign material such as moisture and acid from entering the planarizing film 30 again through the holes 50. Accordingly, it is possible to prevent the degradation in the quality of the organic layer and the peeling of the electrode plate 33 caused by the re-entrance of the foreign material such as moisture and acid.

In addition, in the method of fabricating the display panel apparatus 2 according to Embodiment 2 of the present invention, the holes 50 are covered by the inorganic material layer in a process next to the process for discharging the components such as moisture and acid from the holes 50 by annealing. With this, in the fabrication process after the holes 50 are covered, the planarizing film 30 is not exposed from the holes 50. Accordingly, it is possible to reduce the number of occurrence in which the planarizing film 30 is exposed to foreign material such as moisture and acid. Accordingly, it is possible to prevent the foreign material such as moisture and acid from entering again through the holes 50.

Note that, in the method of fabricating the display panel apparatus 2 according to Embodiment 2 of the present invention, the inorganic layer covering the holes 50 in the electrode plate 33 is formed by extending part of the pixel regulating layer 35 formed in the pixel 51. However, it is not limited to this example. For example, the holes 50 in the electrode plate 33 may be covered with another inorganic material other than the pixel regulating layer 35. In this case, the inorganic layer is formed in the fabrication process different from the method of fabricating the pixel regulating layer 35. Furthermore, even in this case, in order to discharge the components such as moisture and acid in the planarizing film, it is preferable that the thermal treatment is performed before forming the inorganic material layer.

However, it is preferable that the inorganic material layer covering the holes 50 are formed using the pixel regulating layer 35 as illustrated in Embodiment 2. This is because, forming the inorganic layer covering the holes 50 using the pixel regulating layer 35 of the display section 52 allows forming the pixel regulating layer 35 and the inorganic material layer covering the holes 50 in the same process, thereby simplifying the fabrication process and reducing the fabrication cost Embodiment 3

Next, the display panel apparatus 3 according to Embodiment 3 of the present invention shall be described with reference to the drawings. Note that, the same reference numerals are assigned to the components with the same function as the components in the display panel apparatuses 1 and 2 according to Embodiments 1 and 2, and the description for these components are simplified or omitted.

The display panel apparatus 3 according to Embodiment 3 of the present invention is different from the display panel apparatuses 1 and 2 according to Embodiments 1 and 2 in that the configuration of the electrode plate 33 covers the holes 50. More specifically, in the display panel apparatuses 1 and 2 according to Embodiments 1 and 2 of the present invention, the holes 50 are covered by extending either a part of the hole injection layer 34 or the pixel regulating layer 35 made of inorganic material. In contrast, in the display panel apparatus 3 according to Embodiment 3 of the present invention, both the hole injection layer 34 and the pixel regulating layer 35 made of inorganic material are used to cover the holes 50. More specifically, the inorganic material layer covering the holes 50 in the electrode plate 33 has a two-layered structure including the hole injection layer 34 and the pixel regulating layer 35 that are made of inorganic material.

In the display panel apparatus 3 according to Embodiment 3 of the present invention, the region in which the inorganic material layer covering the holes 50 in the electrode plate 33 is identical to a region in which the pixel regulating layer 35 illustrated in FIGS. 11 and 12 is formed outside of the display section 52.

Note that, the hole injection layer 34 in the display section 52 according to Embodiment 3 has the same configuration as the hole injection layer 34 in the display section 52 in the display panel apparatuses 1 and 2 according to Embodiments 1 and 2. In addition, the pixel regulating layer 35 in the display section 52 also has the same configuration as the pixel regulating layer 35 in the display section 52 in the display panel apparatuses 1 and 2 according to Embodiments 1 and 2 of the present invention.

Figure 18:
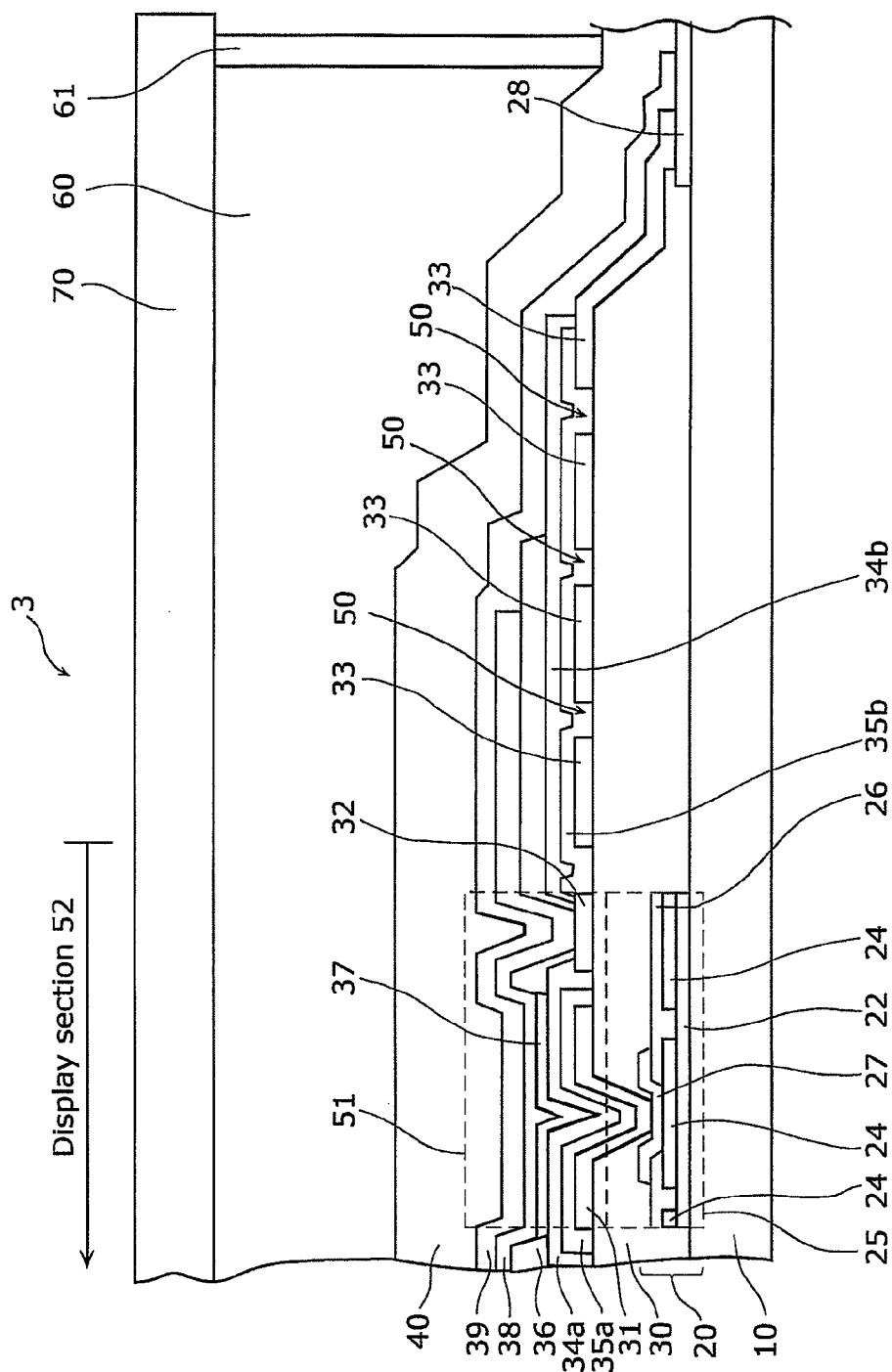
FIG. 18 is a cross-sectional view illustrating an example of the configuration of the display panel apparatus according to Embodiment 3 of the present invention.

The following shall describe the detailed configuration of the display panel apparatus 3 according to Embodiment 3 of the present invention using FIG. 18. FIG. 18 illustrates a cross-sectional structure of the display panel apparatus 3 according to Embodiment 3 of the present invention at a position corresponding to a position of the line FF' in FIG. 12. Since the cross-sectional structure of the pixel 51 illustrated in FIG. 18 is identical to the structure illustrated in FIG. 14, detailed description for the cross-sectional structure is omitted.

As illustrated in FIG. 18, the electrode plate 33 including the holes 50 are formed above the planarizing film 30 outside the display section 52. In Embodiment 3, above the electrode plate 33, a part of the hole injection layer 34 and the pixel regulating layer 35 are formed to extend to outside of the display section 52 such that all of the holes 50 in the electrode plate 33 are covered. More specifically, the hole injection layer 34 and the pixel regulating layer 35 in Embodiment 3 include first portions 34a and 35a located in the pixel 51 and serve as functional layers provided between the planarizing film 30 and the lower electrode 31, and second portions 34a and 35b formed extending from the first portion 35a as the functional layer to outside of the display section 52. Outside of the display section 52, the second portion 35b of the pixel regulating layer 35 and the second portion 34b of the hole injection layer 34 are patterned into the same shape and stacked. The holes 50 in the electrode plate 33 are covered by the second portion 35b in the pixel regulating layer 35 and the second portion 34b of the hole injection layer 34. More specifically, the holes 50 in the electrode plate 33 are closed by filling the inorganic material same as the pixel regulating layer 35, and the inorganic material same as the hole injection layer 34 is formed thereon. Thus, the holes 50 are closed with this layer as well. More specifically, the second portion 35b of the pixel regulating layer 35 filling the holes 50 and the second portion 34b of the hole injection layer 34 are part of the pixel regulating layer 35 and the hole injecting layer 34 provided between the lower electrode 31 and the organic EL layer 37 in the pixel 51, respectively. Note that, on the second portion 34b in the hole injection layer 34, a part in which the bank 36, the electron transport layer 38, and the upper electrode 39 are sequentially formed, and a part in which the upper electrode 39 is directly formed exist.

Here, the pixel regulating layer 35 may be formed with an insulating material. Alternatively, the pixel regulating layer 35 may be formed with metal oxide, metal nitride, or metal oxynitride. For example, $SiO_2$, SiN, SiON, $TiO_2$, TiN, $Al_2O_3$, AlN, and other material may be used. Alternatively, at least one of Silicon (Si), Chromium (Cr), and Titanium (Ti) may be used.

Here, as the inorganic material of the hole injection layer 34, metal oxides, metal nitrides, or metal oxynitrides may be used, for example. Alternatively, the hole injection layer 34 may be formed using at least one of Tungsten (W), Titanium (Ti), Molybdenum (Mo), Vanadium (V), and Gallium (Ga).

Alternatively, the pixel regulating layer 35 and the hole injection layer 34 may be made of the same material. In this case, the two-layered inorganic material layer covering the holes 50 in the electrode plate 33 may be made of the same material.

Alternatively, the inorganic material layer covering the holes 50 in the electrode plate 33 may be configured of two or more layers. In this case, the material of the hole injection layer 34 or the pixel regulating layer 35 described above may be used as the inorganic material for the inorganic material layer.

As described above, the display panel apparatus 3 according to Embodiment 3 of the present invention with the configuration described above has holes 50 in the electrode plate 33 covering the planarizing film 30. With this, even if the planarizing film 30 with the components such as moisture and acid absorbed is covered by the electrode plate 33, the components such as moisture and acid included in the planarizing film 30 are discharged through the holes 50. With this, it is possible to prevent the degradation in the quality of the organic layer due to the leak of the components such as moisture and acid to the organic layer. Furthermore, peeling of the electrode plate 33 and uneven display at the peripheral portion and the peripheral portion turning white due to the reaction with the components such as acid and moisture can be prevented.

Furthermore, the display panel apparatus 3 according to Embodiment 3 of the present invention has the holes 50 in the electrode plate 33 covered with the inorganic material layer made of inorganic material. With this, in the fabrication process after the holes 50 are closed, it is possible to prevent the foreign material such as moisture and acid from entering the planarizing film 30 again through the holes 50. Accordingly, it is possible to prevent the degradation in the quality of the organic layer and the peeling of the electrode plate 33 caused by the re-entrance of the foreign material such as moisture and acid.

Note that, the description on the shapes of the holes with reference to FIGS. 8 and 9 is applicable to the display panel apparatus 3 according to Embodiment 3 of the present invention.

(Fabrication Method for Display Panel Apparatus 3)

Next, the method of fabricating the display panel apparatus 3 according to Embodiment 3 of the present invention shall be described.

The method of fabricating the display panel apparatus 3 according to Embodiment 3 of the present invention is characterized by a process for providing holes in the electrode plate on the planarizing film, a process for discharging the components such as moisture and acid from the planarizing film through the holes, and a process for covering the holes with an inorganic material layer made of inorganic material. The method of fabricating the display panel apparatus 3 according to Embodiment 3 is different from the method of fabricating the display panel apparatuses 1 and 2 according to Embodiments 1 and 2 in the following point. While the holes 50 are covered with either the hole injection layer 34 or the pixel regulating layer 35 made of inorganic material in the methods of fabricating the display panel apparatuses 1 and 2 according to Embodiments 1 and 2 of the present invention, in the method of fabricating the display panel apparatus 3 according to Embodiment 3, the holes 50 are covered by using both the hole injection layer 34 and the pixel regulating layer 35 made of inorganic material.

The following shall describe the method of fabricating the display panel apparatus 3 according to Embodiment 3 of the present invention with reference to the drawings. The example in which the display panel apparatus 3 described above is fabricated shall be described based on FIG. 19 and with reference to FIG. 18.

Figure 19:
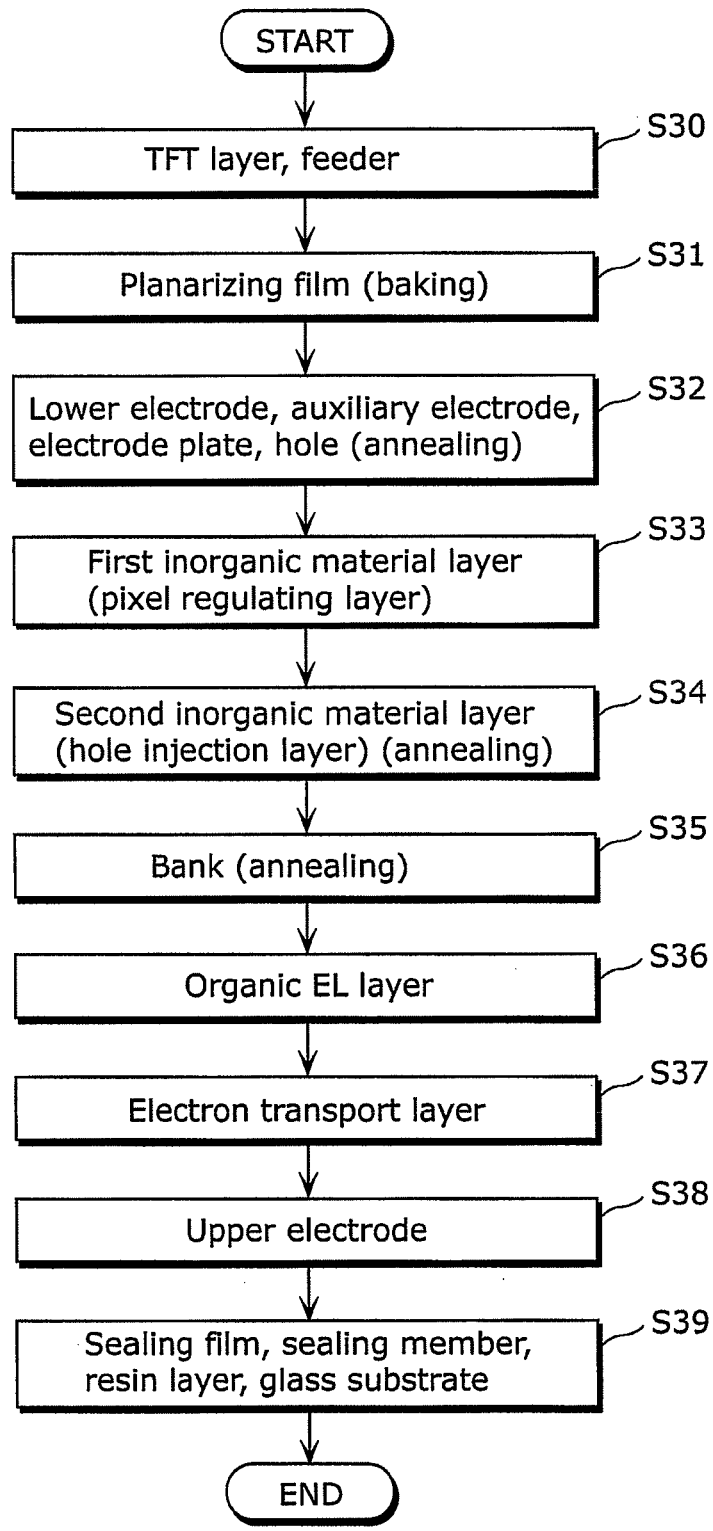
FIG. 19 is a flowchart illustrating the fabrication process of the display panel apparatus according to Embodiment 3 in the present invention.

FIG. 19 is a flowchart illustrating an example of the fabrication process of the display panel apparatus 3 according to Embodiment 3 in the present invention.

(TFT Layer Forming Process)

First, the TFT layer 20 including the driving device 25 and the feeder 28 is formed by forming and patterning a semiconductor film, an insulating film, and a metal film on the main surface of the substrate 10 made of glass or plastic (S30: first process).

(Planarizing Film Forming Process)

Next, by applying insulating organic material such as polyimide resin by spin coating or nozzle coating on an entire surface and baking the surface, the planarizing film 30 is formed. The interlayer insulating film 26 and the planarizing film 30 formed above the source-drain electrode 24 of the driving device 25, and the planarizing film 30 formed above the feeder 28 are removed by photo etching (S31: second process).

(Lower Electrode and Electrode Plate Forming Process)

Next, a metal film is formed above the planarizing film 30 by sputtering, and the metal film is patterned into the lower electrode 31, the auxiliary electrode 32, and the electrode plate 33 with the shape illustrated in FIG. 5 by photo etching. Here, the holes 50 are formed in the electrode plate 33 exposing a part of the surface of the planarizing film 30. Furthermore, the lower electrode 31, the auxiliary electrode 32, and the electrode plate 33 are annealed (S32: third process).

In this process, in the part in which the interlayer insulating film 26 and the planarizing film 30 are removed, the lower electrode 31 and the source-drain electrode 24 of the driving device 25 are electrically connected, and the electrode plate 33 and the feeder 28 are electrically connected. Furthermore, with this annealing thermal treatment, the components such as moisture and acid remaining in the planarizing film 30 is outgassed through the holes 50. With this annealing thermal treatment, the components such as moisture and acid in the planarizing film 30 are outgassed. Note that, in order to completely outgas the components such as moisture and acid in the planarizing film 30 under the electrode plate 33, another outgassing component discharging process in which a thermal treatment is performed at a predetermined temperature may be provided after the lower electrode and electrode plate forming process.

(First Inorganic Material Layer Forming Process (Pixel Regulating Layer Forming Process))

Next, a first inorganic material layer is formed by forming a film made of inorganic compound including insulating inorganic material such as $SiO_2$, SiN, SiON, $TiO_2$, TiN, $Al_2O_3$, AlN and others or a film made of metal such as Silicon (Si), Chromium (Cr), Titanium (Ti) and others on the lower electrode 31, and performing photo-etching (S33: fourth process).

In Embodiment 3, the first inorganic material layer is formed as the pixel regulating layer 35. More specifically, in the display section 52, the inorganic material layer is formed on the lower electrode 31 as the pixel regulating layer 35. The pixel regulating layer 35 is patterned into a predetermined belt-shape. In contrast, outside of the display section 52, the inorganic material layer is formed on the electrode plate 33 as a layer covering the holes 50 in the electrode plate 33.

Note that, immediately before the first inorganic material layer forming process, another outgassing component discharging process in which thermal treatment is performed at a predetermined temperature may be provided as a process for completely outgassing the components such as moisture and acid in the planarizing film 30 under the electrode plate 33.

(Second Inorganic Material Layer Forming Process (Hole Injection Layer Forming Process))

Next, the second inorganic material layer is formed by depositing inorganic material such as W, Ti, Mo, V, and Ga in the display section 52 by vapor deposition and annealing the deposited material (S34: fourth process).

In Embodiment 3, the second inorganic material layer is formed as the hole injection layer 34. More specifically, in the display section 52, the second inorganic material layer is formed on the pixel regulating layer 35 as the pixel regulating layer 34. In contrast, outside the display section 52, the second inorganic material layer is formed above the electrode plate 33 to cover the holes 50 in the electrode plate 33.

Note that, as the inorganic material for the hole injection layer 34, the inorganic material described above shall be used where appropriate.

(Bank Forming Process)

Next, the banks 36 for partitioning pixels in a shape illustrated in FIG. 12 are formed by applying photosensitive polyimide resin by spin coating and nozzle coating on the entire surface, performing patterning by photolithography and annealing (S35: fifth process)

(Organic EL Layer Forming Process)

Next, the organic EL layer 37 is formed by placing functional fluid including organic material with electroluminescent property such as tris(8-hydroxyquinolinato)aluminium (Alq3) on the belt-shaped region partitioned by adjacent banks 36 by inkjet method, and drying the functional fluid (S36: sixth process).

(Electron Transport Layer Forming Process)

Next, the electron transport layer 38 is formed by depositing organic material made of oxadiazole derivatives and others by vacuum vapor deposition (S37: eighth process).

(Upper Electrode Forming Process)

Next, the upper electrode 39 is formed by depositing transparent conductive material such as Indium Tin Oxide or Indium Zinc Oxide by vacuum vapor deposition (S38: seventh process).

(Sealing Process)

Finally, the display panel apparatus 1 is complete by providing the sealing film 40, the resin layer 60, the sealing member 61, and the glass substrate 70 (S39: ninth process).

As described above, according to the method of fabricating the display panel apparatus 3 according to Embodiment 3 of the present invention, the holes 50 for discharging the outgas included in the planarizing film 30 are provided in the electrode plate 33 covering the planarizing film 30. With this, even if the planarizing film 30 with the components such as moisture and acid absorbed is covered by the electrode plate 33, the components such as moisture and acid included in the planarizing film 30 is discharged through the holes 50. With this, it is possible to prevent the degradation in the quality of the organic layer due to the leak of the components such as moisture and acid to the organic layer. Furthermore, peeling off of the electrode plate 33 and uneven display at the peripheral portion and the peripheral portion turning white due to the reaction with the components such as acid and moisture can be prevented. Furthermore, it is possible to prevent the planarizing film from being eroded by moisture and acid remaining in the planarizing film.

Furthermore, by the method of fabricating the display panel apparatus 3 according to Embodiment 3 of the present invention, the holes 50 in the electrode plate 33 are covered by the inorganic material layer made of inorganic material. With this, in the fabrication process after the holes 50 are closed, it is possible to prevent the foreign material such as moisture and acid from entering the planarizing film 30 again through the holes 50. Accordingly, it is possible to prevent the degradation in the quality of the organic layer and the peeling of the electrode plate 33 caused by the re-entrance of the foreign material such as moisture and acid.

In addition, in the method of fabricating the display panel apparatus 3 according to Embodiment 3 of the present invention, the holes 50 are covered by the inorganic material layer in a process next to the process for discharging the components such as moisture and acid from the holes 50 by annealing. With this, in the fabrication process after the holes 50 are covered, the planarizing film 30 is not exposed from the holes 50. Accordingly, it is possible to reduce the number of occurrence in which the planarizing film 30 is exposed to foreign material such as moisture and acid. Accordingly, it is possible to prevent the foreign material such as moisture and acid from entering again through the holes 50.

Furthermore, in the method of fabricating the display panel apparatus 3 according to Embodiment 3 of the present invention, the inorganic material layer has multiple layers. Thus, it is possible to reliably prevent the foreign material such as moisture and acid from re-entering through the holes 50.

Note that, although two layers of the inorganic material layers are formed using the hole injection layer 34 and the pixel regulating layer 35 in the method of fabricating the display panel apparatus 3 according to Embodiment 3 of the present invention, it is not limited to this example. For example, the holes 50 may be covered with an inorganic material other than the hole injection layer 34 and the pixel regulating layer 35. Alternatively, one of the multiple inorganic material layers may be formed using the hole injection layer 34 or the pixel regulating layer 35, and another inorganic material layer may be formed using an inorganic layer other than the hole injection layer 34 or the pixel regulating layer 35. In these cases, it is preferable that the other inorganic material layer is formed in a fabrication process different from the fabrication process for the hole injection layer 34 or the pixel regulating layer 35. Furthermore, even in this case, in order to discharge the components such as moisture and acid in the planarizing film, it is preferable that the thermal treatment is performed before forming the inorganic material layer.

However, as described in Embodiment 3, it is preferable to form the inorganic material layer using the hole injection layer 34 or the pixel regulating layer 35. This is because, forming the inorganic layer covering the holes 50 using the hole injection layer 34 and the pixel regulating layer 35 of the display section 52 allows forming the hole injection layer 34 and the pixel regulating layer 35 and the inorganic material layer covering the holes 50 in the same process, thereby simplifying the fabrication process and reducing the fabrication cost.

(Examples of the Usage of Display Panel Apparatus)

The display panel apparatuses 1, 2, and 3 described above are used for a display apparatus for a television set, for example.

Figure 20:
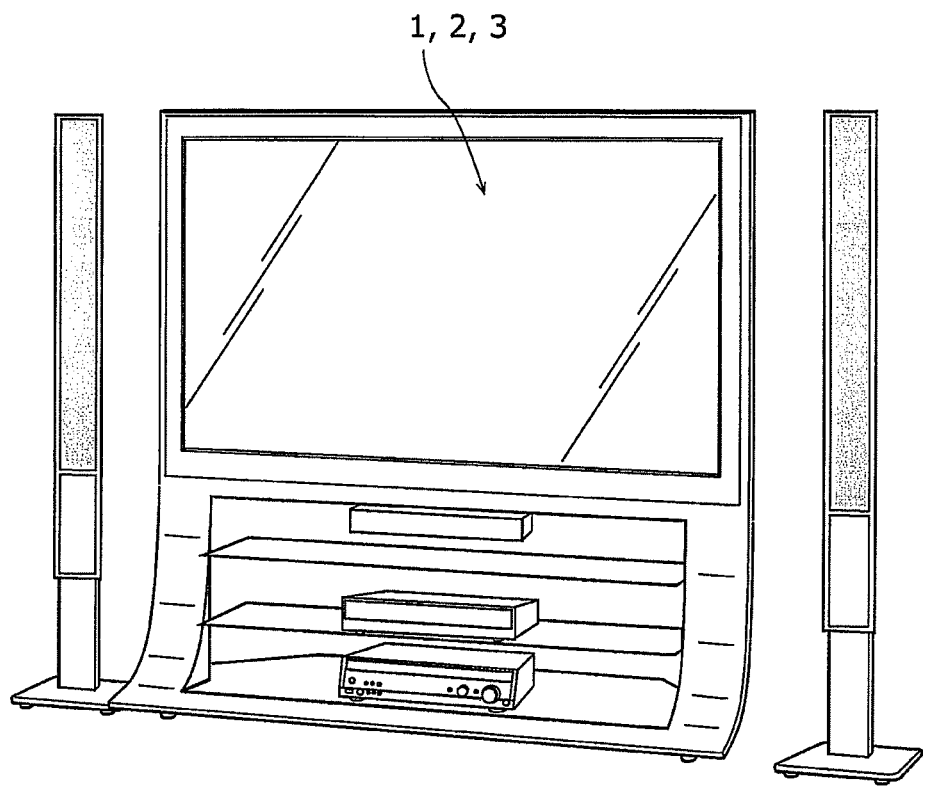
FIG. 20 is an external view illustrating an example of a television set using the display panel apparatus.

FIG. 20 is an external view of the television set as an example of the display apparatus using the display panel apparatuses 1, 2, and 3. According to Embodiment 3, the display panel apparatuses 1, 2, and 3 may be used for the display apparatus.

The display panel apparatuses 1, 2, and 3 may be used as a display apparatus for mobile phones, personal computers, and others, in addition to the television set described above.

(Variation)

Although only some exemplary embodiments of the display panel apparatus according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Figure 21:
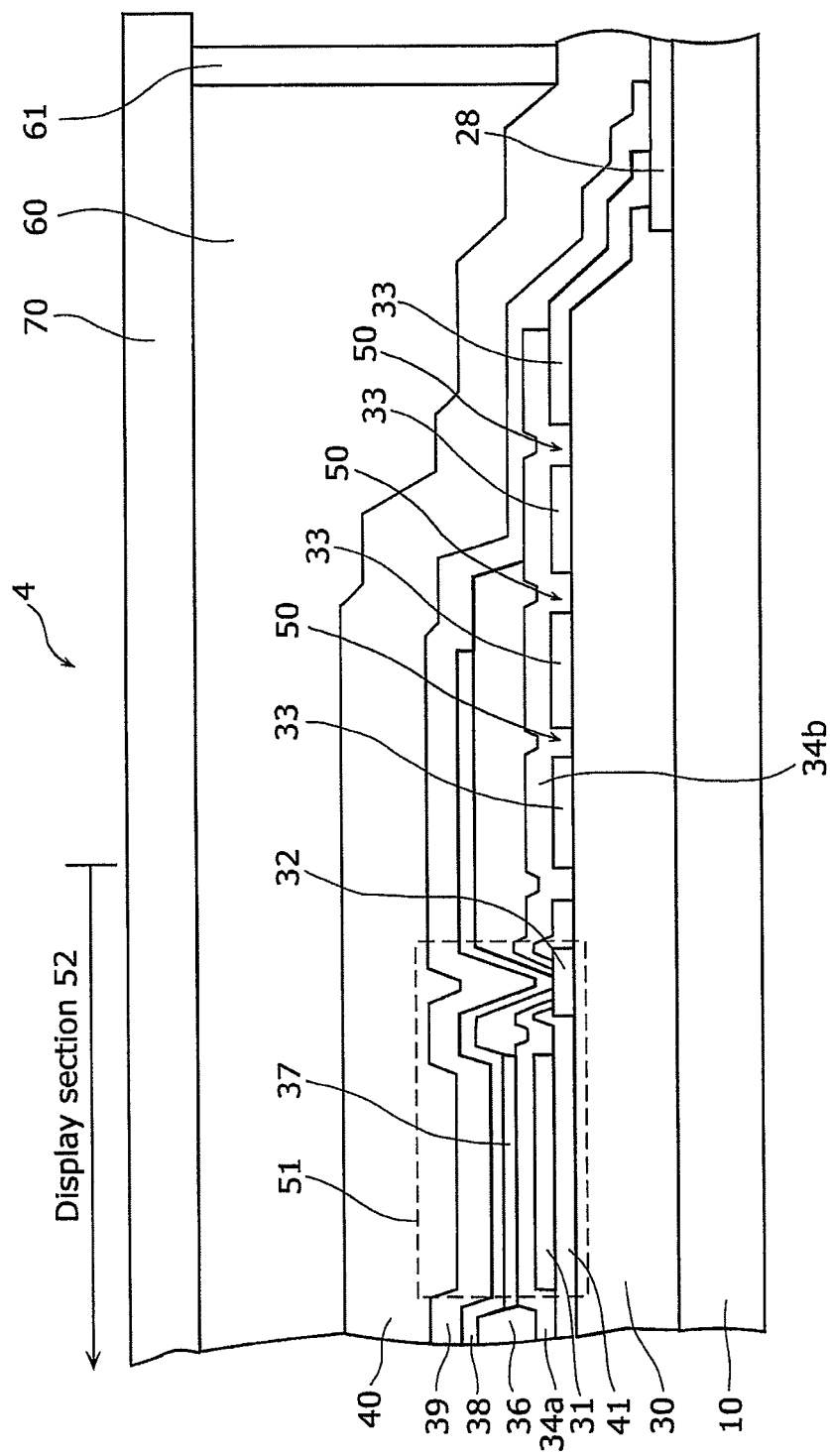
FIG. 21 is a cross-sectional view illustrating an example of the configuration of the display panel apparatus according to Variation.
Figure 22:
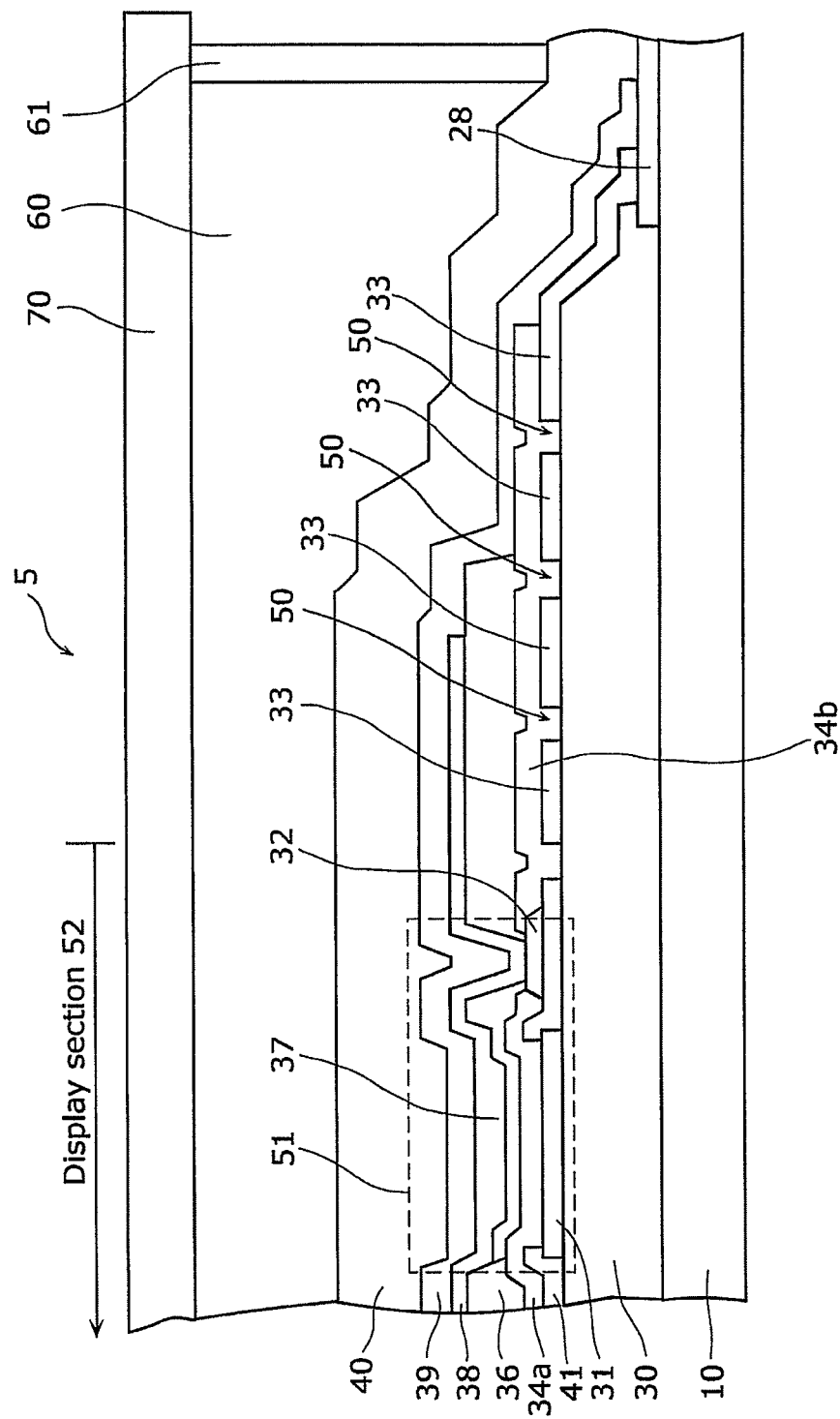
FIG. 22 is a cross-sectional view illustrating an example of the configuration of the display panel apparatus according to Variation.

For example, as illustrated in FIG. 21 or 22, the lower electrode 31 and the auxiliary electrode 32 may be formed in different layers interposing the insulating film.

FIG. 21 is a cross-sectional view illustrating an example of the configuration of the display panel apparatus 4 according to Variation. FIG. 21 illustrates a cross-sectional surface corresponding to the cross-sectional surface of the display panel apparatus 1 illustrated in FIG. 4.

As illustrated in FIG. 21, in the display panel apparatus 4, the auxiliary electrode 32 is arranged on an upper surface of the planarizing film 30, and the lower electrode 31 is provided on the upper surface of the insulating film 41 covering the auxiliary electrode 32.

With this configuration, the lower electrode 31 and the auxiliary electrode 32 are electrically insulated by the insulating film 41, increasing flexibility in arrangement of the auxiliary electrode 32.

For example, arranging the auxiliary electrode 32 in a wide region overlapping the lower electrode 31 in planar view and in a different layer from the lower electrode 31 interposing the insulating film 41 allows reducing the electric resistance of the auxiliary electrode 32, and stably supplying more operational current.

FIG. 22 is a cross-sectional view illustrating an example of the configuration of the display panel apparatus 5 according to Variation. FIG. 22 illustrates a cross-sectional surface corresponding to the cross-sectional surface of the display panel apparatus 1 illustrated in FIG. 4.

As illustrated in FIG. 22, in the display panel apparatus 5, the lower electrode 31 and the electrode plate 33 may be provided on an upper surface of the planarizing film 30, and the auxiliary electrode 32 may be provided on the upper surface of the insulating film 41 covering the lower electrode 31 and the planarizing film 30. More specifically, the auxiliary electrode 32 may be provided in a layer above the lower electrode 31.

Figure 23:
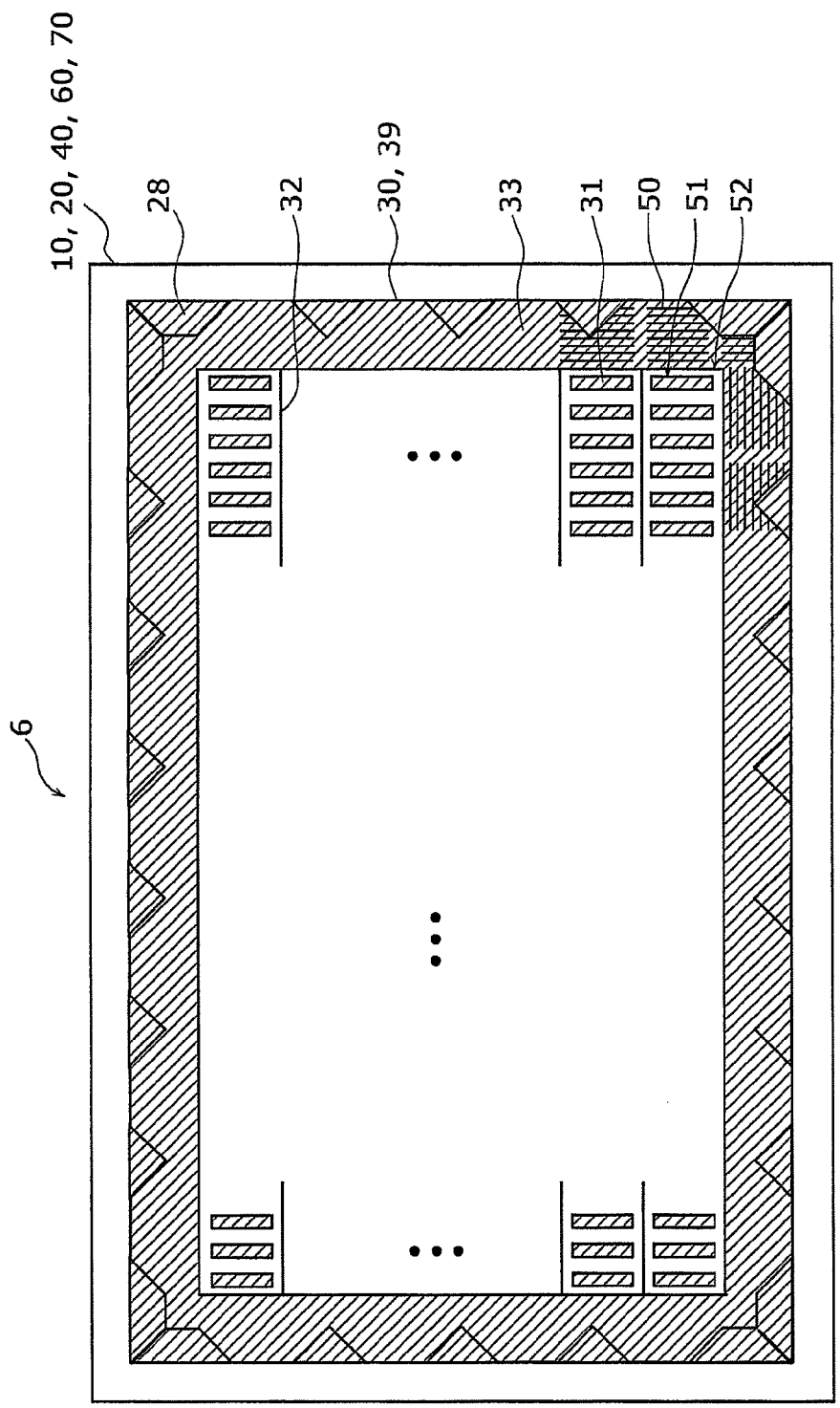
FIG. 23 is a planar view illustrating an example of the configuration of the display panel apparatus according to Variation.
Figure 24:
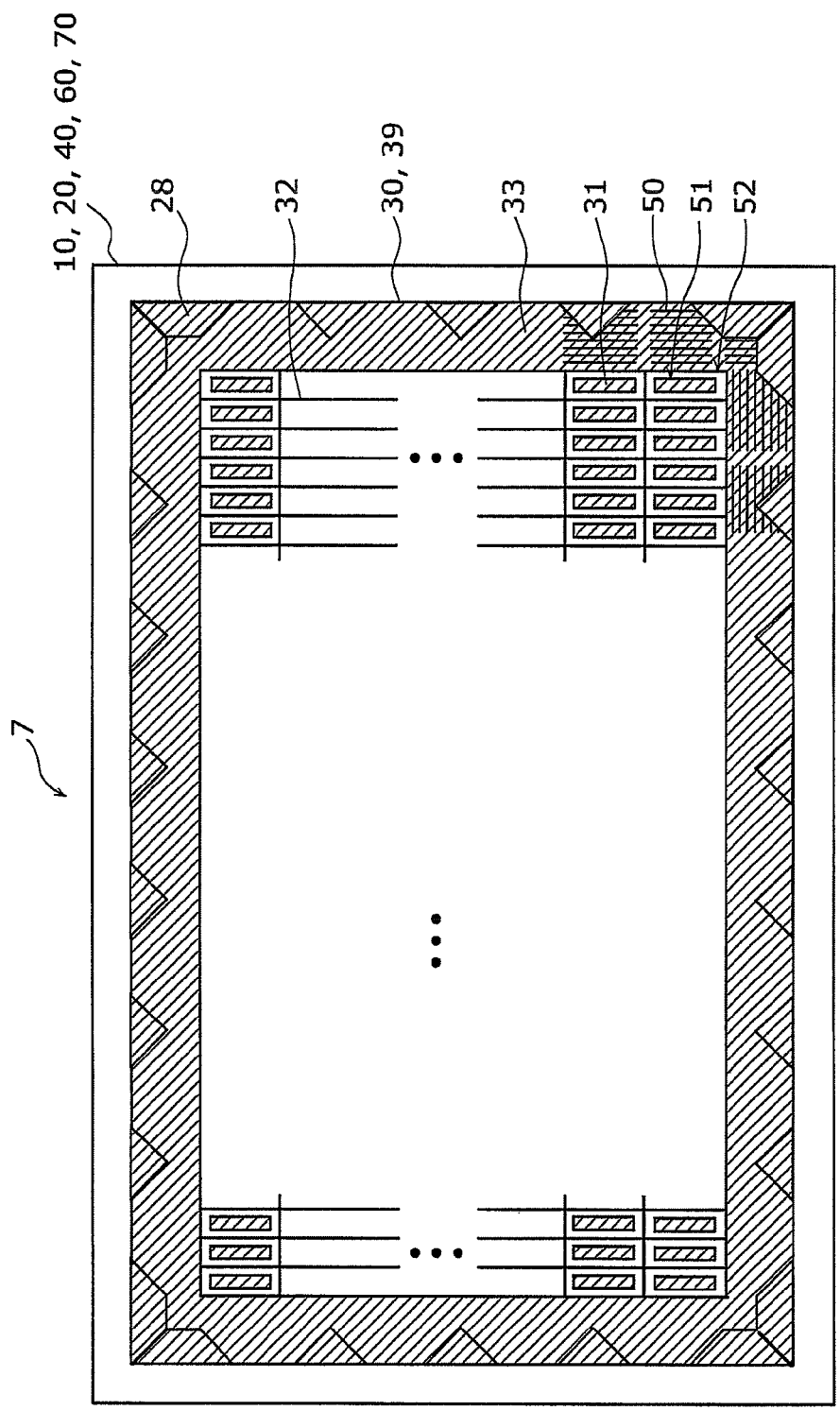
FIG. 24 is a planar view illustrating an example of the configuration of the display panel apparatus according to Variation.

FIGS. 23 and 24 are planar views illustrating examples of the configuration of the display panel apparatuses 6 and 7 according to Variation.

As illustrated in the display panel apparatus 6 in FIG. 23, the auxiliary electrode 32 may be provided only in a direction orthogonal to the banks 36 (row direction). Alternatively, as in the display panel apparatus 7 illustrated in FIG. 24, the auxiliary electrodes 32 may be provided along the direction in parallel with the banks 36 (column direction) and orthogonal to the banks 36 (row direction).

Furthermore, the specific arrangement of the holes 50 is not limited to the example illustrated in FIG. 2. For example, there is another arrangement of the holes 50 suitable for a color display panel apparatus in which one pixel includes three sub pixels each of which emits light in red, green, or blue.

Figure 25:
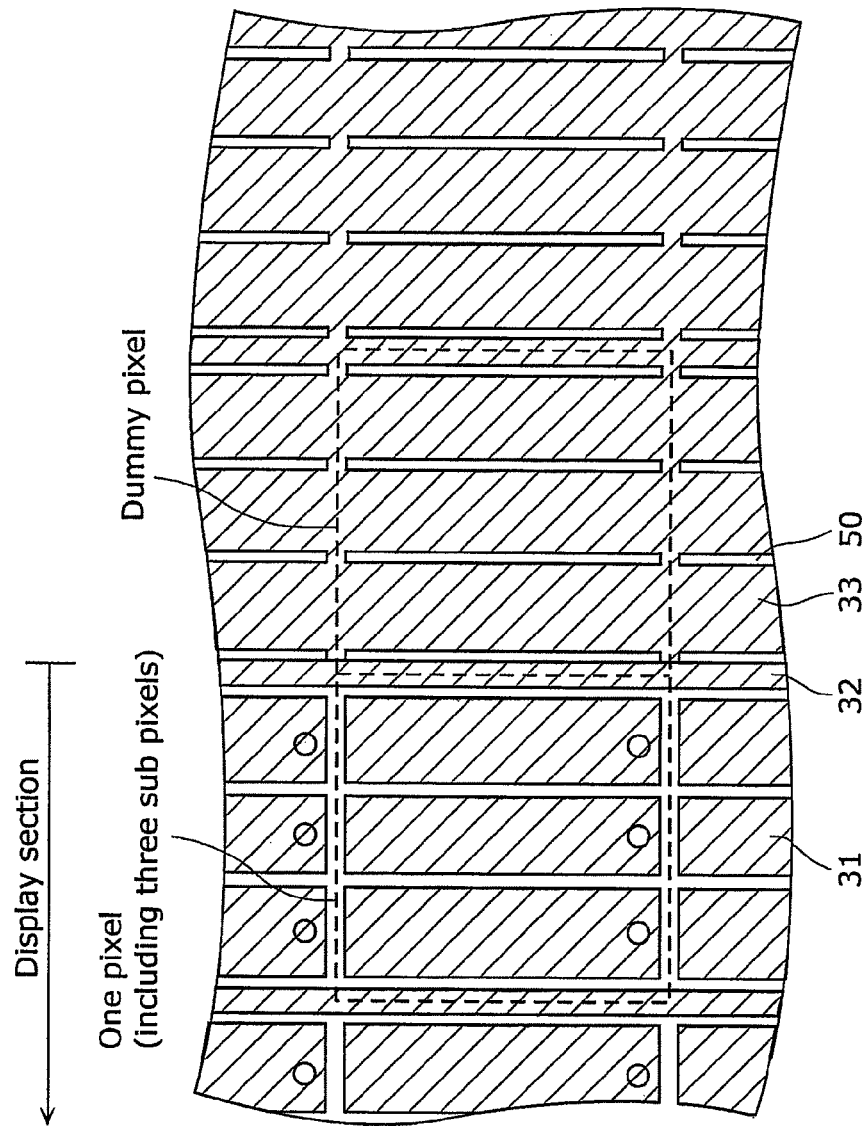
FIG. 25 is a planar view schematically illustrating an example of the arrangement of holes according to Variation.

FIG. 25 is a planar view schematically illustrating an example of the arrangement of the holes 50 according to Variation.

In FIG. 25, areas in which the lower electrodes 31, the auxiliary electrodes 32, and the electrode plate 33 are provided are indicated by hatching. Small circles indicate contact holes for connecting the lower electrode 31 and the driving device in a lower layer. In addition, banks that are not illustrated are provided in vertical direction between the lower electrodes which are adjacent to each other in horizontal direction and between the lower electrodes 31 and the auxiliary electrodes 32.

In the display section, three adjacent belt-shaped regions partitioned by the banks form one pixel column, and the organic EL layers each of which emits light in red, green, or blue are provided in the three belt-shaped regions. With this, the three sub pixels each of which emits light in red, green, or blue are arranged next to one another in horizontal direction (row direction), and the three sub pixels form one pixel.

The holes are formed in the shape of dummy pixels mocking the shape of the pixels in the display section. More specifically, one pixel in the display section and one dummy pixel in the holes have the same size, and the holes 50 are formed in the dummy pixels at a position same as the position in the pixels in which the lower electrode 31 and the auxiliary electrode 32 are separated (the plain part between the adjacent lower electrodes 31 and between the lower electrodes 31 and the auxiliary electrodes 32.

According to the arrangement of the holes 50, the lower electrodes 31, the auxiliary electrodes 32, and the electrode plate 33 are formed by repeating the approximately same shape from the display section to the holes, making the aperture ratio of the planarizing film uniform.

With this, the components such as moisture and acid included in the planarizing film is discharged at a same level in the display section and the region outside of the display section, preventing the components such as moisture and acid from excessively sealed in the planarizing film outside the display section. Thus, it is possible to reduce defects of shrinking pixels at the peripheral portion of the display section, uneven display of the peripheral portion or the peripheral portion turning white.

Figure 26:
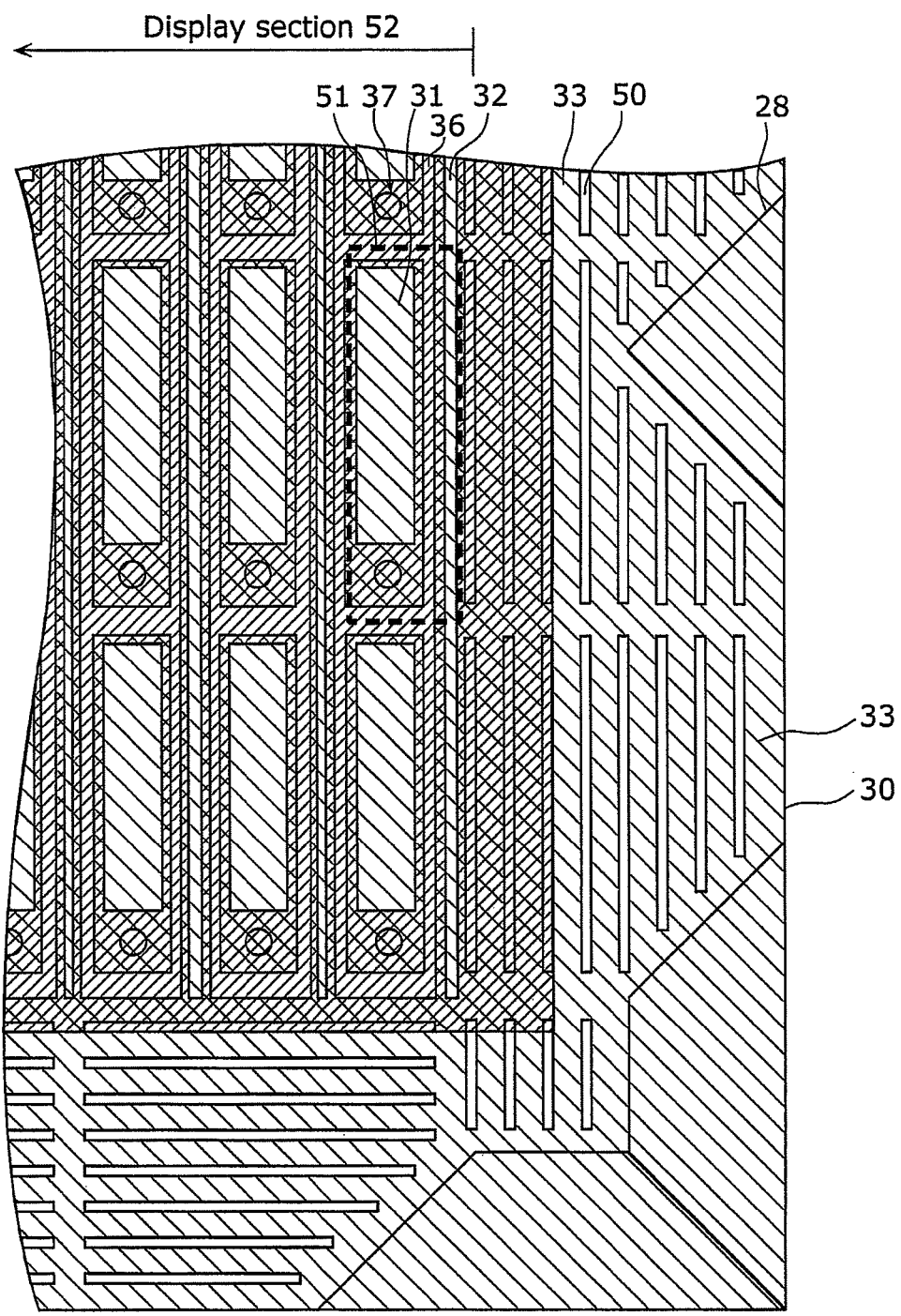
FIG. 26 is an enlarged planar view illustrating an example of the configuration of the display panel apparatus according to Variation.

FIG. 26 is an enlarged planar view illustrating an example of the configuration of the display panel apparatus 8 according to Variation.

As illustrated in FIG. 26, in the display panel apparatus 8 according to this variation, the banks 36 are provided in both vertical direction and horizontal direction of the drawings. In Embodiment 1, the pixels 51 arranged in the vertical direction of the drawing are partitioned by the pixel regulating layer. In the configuration according to Variation, the pixels 51 are partitioned by the pixel regulating layer. In the configuration according to Variation, each pixel 51 is partitioned by the banks 36 in both vertical direction and horizontal direction of the drawing, allowing omitting the pixel regulating layer.

Note that, Embodiments illustrate configurations in which the lower electrodes 31 are used as the anode and the upper electrode 39 is used as the cathode, for example. However, the lower electrodes 31 may be used as the cathode, and the upper electrode 39 may be used as the anode. In this case, the electron transport layer 38 is arranged below the organic EL layer 37, and the hole injection layer 34 is arranged above the organic EL layer 37.

In Embodiments, the stacked structure of the organic EL layer 37 and the electron transport layer 38 are described as an example of the organic layer. However, the configuration of the organic layer is not limited to this example. For example, a known stacked structure including the hole transport layer, the organic EL layer, and the electron transport layer may be used as the organic layer. Alternatively, when forming the hole injection layer or the electron injection layer with an organic material, these layers may be included in the organic layer. Furthermore, the layers other than the organic EL layer are provided where appropriate for achieving good light-emission performance, and can be omitted.

Note that, in Embodiments described above, the inorganic material layer such as the hole injection layer or the pixel regulating layer are provided in contact with the upper surface of the electrode plate. After directly covering the holes in the electrode plate by the inorganic material layer, the organic layer (organic EL layer) is formed in the pixel, and the upper electrode is subsequently formed on the inorganic material layer. Accordingly, the foreign materials such as moisture and acid in the organic EL layer forming process could not enter the inside of the planarizing film through the holes in the electrode plate. With this, it is possible to prevent the degradation in the quality of the planarizing layer and the peeling of the electrode plate.

On the other hand, when the upper electrode above the organic EL layer is formed in contact with the upper surface of the electrode plate and to directly cover the holes unlike Embodiments above, the organic layer such as the organic EL layer is formed after the electrode plate is formed and before the upper electrode is formed. With this configuration, there is a possibility that the foreign materials such as the moisture and acid included in chemical solutions and cleaning solutions enter the inside of the planarizing film again through the holes. Consequently, there is a possibility that the upper electrode is formed with the foreign materials remaining in the planarizing film. For this reason, with this configuration, with the foreign material entering in the planarizing film, there is a possibility that the quality of the planarizing film is degraded and the electrode plate is peeled.

Accordingly, as described above, the configuration in which the upper electrode directly covers the holes of the electrode plate having the upper electrode in contact with the upper surface of the electrode plate is not Embodiments of the present invention but a comparative example. Therefore, this configuration is not included in the present invention.

INDUSTRIAL APPLICABILITY

The display panel apparatus according to the present invention is applicable to any display apparatus for television sets, mobile phones, personal computers, and others.

What is claimed is:
1. A display panel apparatus, comprising:
at least one pixel including a lower electrode, an upper electrode provided opposite the lower electrode, and an organic layer having an organic material provided between the lower electrode and the upper electrode;
a TFT (thin film transistor) layer formed below said at least one pixel and including a driver that drives said at least one pixel;
a planarizing film for planarizing an upper surface of the TFT layer;
an auxiliary electrode formed separately from said lower electrode and electrically connected to said upper electrode;
a display that includes a plurality of the at least pixel;
an electrode plate electrically connected to said auxiliary electrode arranged to cover said planarizing film outside the display, said electrode plate having a hole exposing a part of a surface of said planarizing film; and
an inorganic material layer including an inorganic material, in contact with an upper surface of said electrode plate, located below said upper electrode, and covering said hole.

2. The display panel apparatus of claim 1, wherein said inorganic material layer is formed after said electrode plate is formed and before said organic layer is formed.

3. The display panel apparatus of claim 1, wherein said inorganic material layer comprises:
a first portion located in said at least one pixel, which serves as a functional layer provided between said lower electrode and said organic layer; and
a second portion extending from said first portion and arranged outside sais at least one pixel such that at least a portion of said second portion covers said hole.

4. The display panel apparatus of claim 3, wherein said inorganic material layer comprises:
at least one of a hole injection layer for injecting holes from said lower electrode into said organic layer and a pixel regulating layer for regulating said at least one pixel.

5. The display panel apparatus of claim 1, wherein said inorganic material has an insulation property.

6. The display panel apparatus of claim 1, wherein said inorganic material comprises one of a metal oxide, a metal nitride, or a metal oxynitride.

7. The display panel apparatus of claim 1, wherein said inorganic material comprises at least one of Si, W, Cr, Ti, Mo, V, and Ga.

8. The display panel apparatus of claim 1, wherein said inorganic material layer includes at least two layers.

9. The display panel apparatus of claim 1, wherein said hole functions to discharge a gas generated inside said planarizing film to outside said planarizing film.

10. A display apparatus, comprising:
the display panel apparatus according to claim 1, wherein said plurality of said at least one pixel in the display panel apparatus are arranged in a matrix.

11. A display panel apparatus, comprising:
at least one pixel including a lower electrode, an upper electrode provided opposite said lower electrode, and an organic layer having an organic material provided between said lower electrode and said upper electrode;
a TFT (thin film transistor) layer formed below said at least one pixel, including a driver that drives said at least one pixel;
a planarizing film for planarizing an upper surface of said TFT layer;
an auxiliary electrode formed separately from said lower electrode and electrically connected to said upper electrode;
a display including a plurality of said at least one pixel;
an electrode plate formed in a same layer as said lower electrode, electrically connected to said auxiliary electrode, and arranged to cover said planarizing film outside said display, said electrode plate having a hole exposing a part of a surface of said planarizing film; and
an inorganic material layer including an inorganic material located above said electrode plate, and covering said hole, the inorganic material layer being a part of a layer formed between said lower electrode and said organic layer in said at least one pixel.

12. The display panel apparatus of claim 11, wherein said inorganic material layer comprises:
a first portion located in said at least one pixel which serves as a functional layer provided between said lower electrode and said organic layer; and a second portion extending from said first portion and arranged outside said at least one pixel such that at least a portion of said second portion covers said hole.

13. The display panel apparatus of claim 12, wherein said inorganic material layer comprises:
at least one of a hole injection layer for injecting holes from said lower electrode into said organic layer and a pixel regulating layer that regulates said at least one pixel.

14. The display panel apparatus of claim 11, wherein said hole functions to discharge a gas generated inside said planarizing film to outside said planarizing film.

15. A display apparatus, comprising:
the display panel apparatus of claim 11, wherein said plurality of at least one pixel in said display panel apparatus are arranged in a matrix.

* * * * *